(12) United States Patent
Kim

(10) Patent No.: US 11,817,443 B2
(45) Date of Patent: Nov. 14, 2023

(54) SEMICONDUCTOR PACKAGE INCLUDING A FIRST SEMICONDUCTOR CHIP WITH A PLURALITY OF FIRST CHIP PADS DIRECTLY BONDED TO A PLURALITY OF SECOND CHIP PADS OF AN UPPER SEMICONDUCTOR CHIP

(71) Applicant: Samsung Electronics Co., Ltd., Suwon-si (KR)

(72) Inventor: Younglyong Kim, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/541,869

(22) Filed: Dec. 3, 2021

(65) Prior Publication Data

US 2022/0093582 A1     Mar. 24, 2022

Related U.S. Application Data

(63) Continuation of application No. 16/916,779, filed on Jun. 30, 2020, now Pat. No. 11,222,882.

(30) Foreign Application Priority Data

Nov. 28, 2019    (KR) ........................ 10-2019-0155575

(51) Int. Cl.
| | |
|---|---|
| *H01L 25/18* | (2023.01) |
| *H01L 23/00* | (2006.01) |
| *H01L 23/48* | (2006.01) |
| *H01L 23/538* | (2006.01) |

(52) U.S. Cl.
CPC ............ *H01L 25/18* (2013.01); *H01L 23/481* (2013.01); *H01L 23/5384* (2013.01); *H01L 24/05* (2013.01); *H01L 24/14* (2013.01)

(58) Field of Classification Search
CPC ....... H01L 25/18; H01L 24/14; H01L 23/481; H01L 24/05; H01L 23/53845
See application file for complete search history.

(56) References Cited

U.S. PATENT DOCUMENTS

| | | | |
|---|---|---|---|
| 6,656,271 B2 | 12/2003 | Yonehara et al. | |
| 6,762,076 B2 | 7/2004 | Kim et al. | |
| 8,456,856 B2 * | 6/2013 | Lin ....................... | H01L 23/481 |
| | | | 361/783 |
| 8,736,035 B2 * | 5/2014 | Hwang .................. | H01L 24/97 |
| | | | 257/691 |
| 9,589,945 B2 | 3/2017 | Jo et al. | |
| 10,290,571 B2 | 5/2019 | Yu et al. | |

(Continued)

FOREIGN PATENT DOCUMENTS

TW        201916191 A     4/2019

*Primary Examiner* — Mamadou L Diallo
(74) *Attorney, Agent, or Firm* — Harness, Dickey & Pierce, P.L.C.

(57) ABSTRACT

Disclosed is a semiconductor package including a first semiconductor chip on a substrate, a second semiconductor chip on the substrate and laterally spaced apart from the first semiconductor chip, a dummy chip on the first semiconductor chip, and a dielectric layer between the first semiconductor chip and the dummy chip. A top surface of the first semiconductor chip may be lower than a top surface of the second semiconductor chip. The dielectric layer may include an inorganic dielectric material.

17 Claims, 20 Drawing Sheets

(56) References Cited

U.S. PATENT DOCUMENTS

| | | | |
|---|---|---|---|
| 10,319,699 B2* | 6/2019 | Wei | H01L 24/17 |
| 10,770,430 B1* | 9/2020 | Kim | H01L 25/50 |
| 2006/0027841 A1* | 2/2006 | Tamaki | H01L 25/03 |
| | | | 257/E25.011 |
| 2012/0248439 A1* | 10/2012 | Lee | H01L 23/49838 |
| | | | 257/777 |
| 2013/0099368 A1* | 4/2013 | Han | H01L 23/13 |
| | | | 257/713 |
| 2015/0010269 A1* | 1/2015 | Jo | G02B 6/43 |
| | | | 385/14 |
| 2017/0358540 A1* | 12/2017 | Min | H01L 23/552 |
| 2018/0068958 A1* | 3/2018 | Cho | H01L 25/0657 |
| 2018/0158749 A1 | 6/2018 | Yu et al. | |
| 2018/0254260 A1* | 9/2018 | Wei | H01L 25/0652 |
| 2019/0115272 A1 | 4/2019 | Yu et al. | |
| 2019/0131203 A1* | 5/2019 | Kang | H01L 25/0657 |
| 2019/0131276 A1 | 5/2019 | Chen et al. | |
| 2019/0198489 A1 | 6/2019 | Kim et al. | |
| 2019/0198667 A1 | 6/2019 | Liu et al. | |
| 2019/0206807 A1 | 7/2019 | Cho | |
| 2019/0237412 A1 | 8/2019 | Lee | |
| 2019/0237454 A1 | 8/2019 | Hou et al. | |
| 2019/0259743 A1 | 8/2019 | Han | |
| 2019/0318975 A1 | 10/2019 | Shi et al. | |
| 2020/0020647 A1* | 1/2020 | Jee | H01L 25/105 |
| 2020/0411483 A1* | 12/2020 | Uzoh | H01L 23/3121 |
| 2021/0125899 A1* | 4/2021 | Bitz | H01L 25/0657 |

\* cited by examiner

SEMICONDUCTOR PACKAGE INCLUDING A FIRST SEMICONDUCTOR CHIP WITH A PLURALITY OF FIRST CHIP PADS DIRECTLY BONDED TO A PLURALITY OF SECOND CHIP PADS OF AN UPPER SEMICONDUCTOR CHIP

CROSS-REFERENCE TO RELATED APPLICATION

This U.S. nonprovisional application is a continuation of U.S. application Ser. No. 16/916,779, filed Jun. 30, 2020, and claims priority under 35 U.S.C § 119 to Korean Patent Application No. 10-2019-0155575 filed on Nov. 28, 2019, in the Korean Intellectual Property Office, the disclosure of each of which is hereby incorporated by reference in its entirety.

BACKGROUND

Inventive concepts relate to a semiconductor package, and more particularly, to a semiconductor package in which a plurality of semiconductor chips are mounted.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. With the development of the electronic industry, there is a demand for smaller, lighter, and multifunctional electronic devices, and therefore there is suggested a multi-chip package in which a plurality of chips are stacked in a single semiconductor package or a system-in-package which has different kinds of chips mounted in a single semiconductor package and which operates as one system.

SUMMARY

Some example embodiments of inventive concepts provide a semiconductor package in which a plurality of semiconductor chips are easily mounted and heat radiation is improved.

According to some example embodiments of inventive concepts, a semiconductor package may include: a substrate; a first semiconductor chip on the substrate; a second semiconductor chip on the substrate, the second semiconductor chip laterally spaced apart from the first semiconductor chip, the second semiconductor chip arranged so a top surface of the first semiconductor chip is lower than a top surface of the second semiconductor chip; a dummy chip on the first semiconductor chip; and a dielectric layer between the first semiconductor chip and the dummy chip. The dielectric layer may include an inorganic dielectric material.

According to some example embodiments of inventive concepts, a semiconductor package may include: a first substrate; a second substrate on and electrically connected to the first substrate; a first semiconductor chip on the second substrate; a second semiconductor chip on the second substrate, the second semiconductor chip laterally spaced apart from the first semiconductor chip, the second semiconductor chip arranged so a top surface of the first semiconductor chip is lower than a top surface of the second semiconductor chip; a dummy chip on the first semiconductor chip; and a dielectric layer between the first semiconductor chip and the dummy chip. The dielectric layer may include an inorganic dielectric material.

According to some example embodiments of inventive concepts, a semiconductor package may comprise: a substrate; a first semiconductor chip on the substrate, the first semiconductor chip including a plurality of first chip pads adjacent to a top surface of the first semiconductor chip; a second semiconductor chip on the substrate, the second semiconductor chip laterally spaced apart from the first semiconductor chip; and an upper semiconductor chip on the first semiconductor chip. A bottom surface of the upper semiconductor chip may face a top surface of the first semiconductor chip. The upper semiconductor chip may include a plurality of second chip pads adjacent to the bottom surface of the upper semiconductor chip. The plurality of second chip pads may be directly connected to the plurality of first chip pads. The top surface of the first semiconductor chip may be lower than a top surface of the second semiconductor chip.

DETAILED DESCRIPTION

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The following will now describe in detail some example embodiments of inventive concepts with reference to the accompanying drawings.

Figure 1:
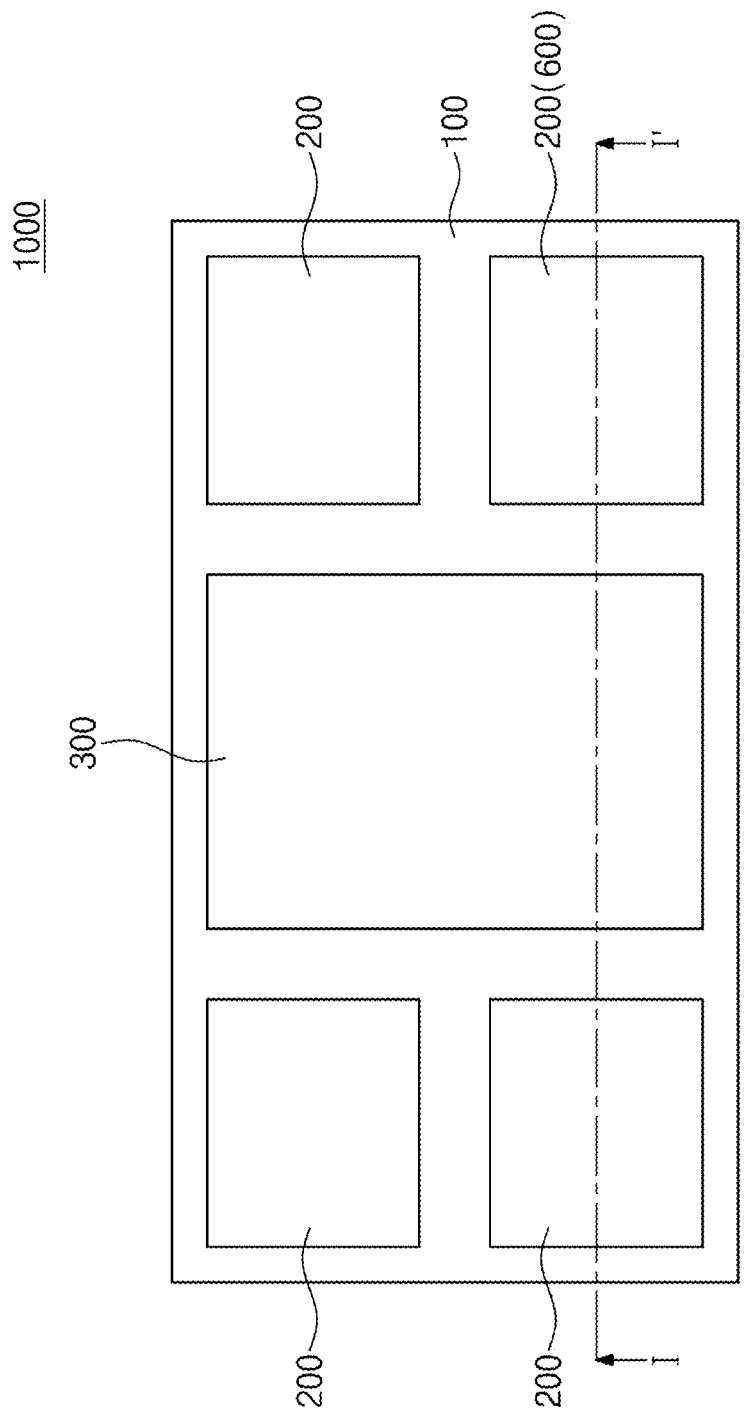
FIG. 1 illustrates a plan view showing a semiconductor package according to some example embodiments of inventive concepts.
Figure 2:
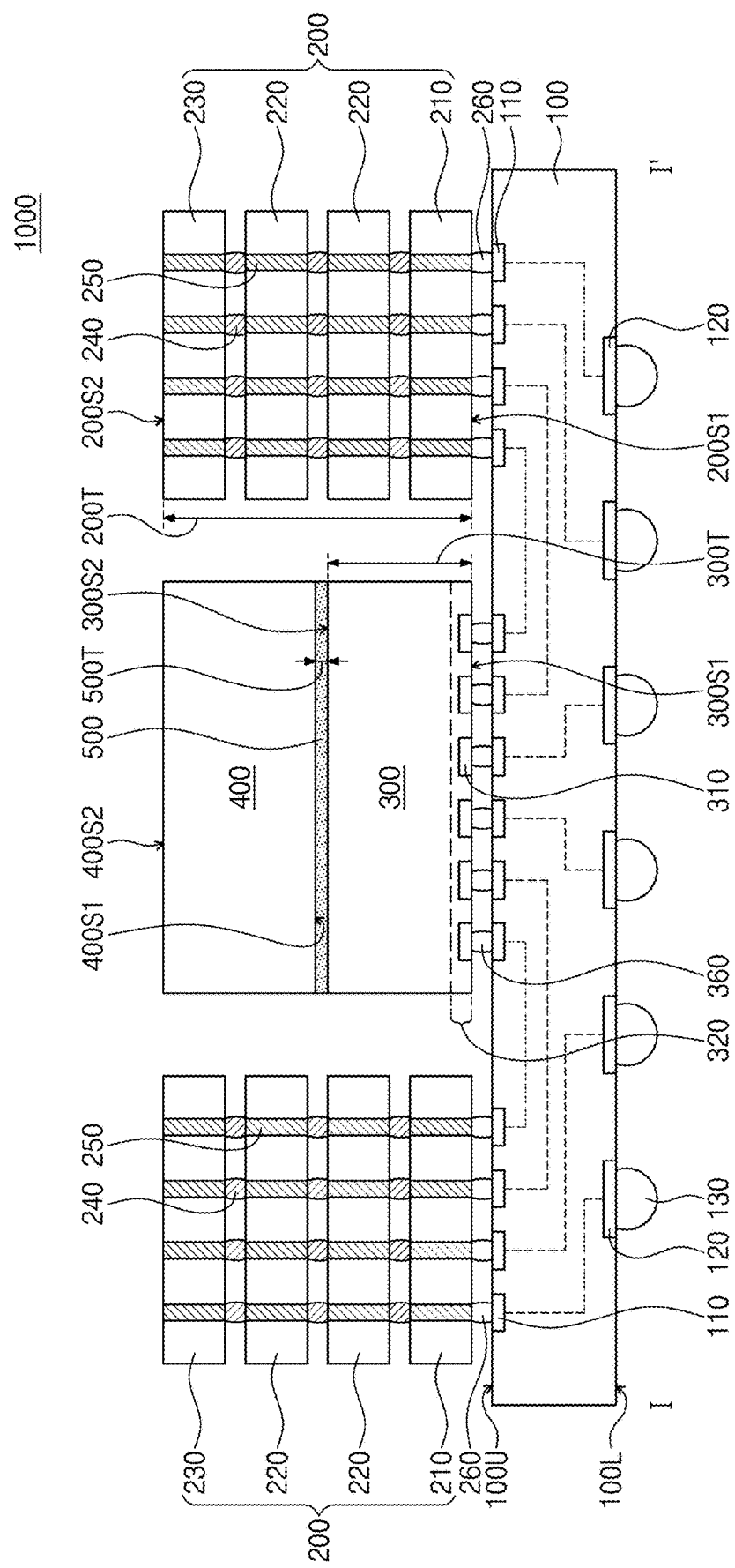
FIG. 2 illustrates a cross-sectional view taken along line I-I' of FIG. 1.

FIG. 1 illustrates a plan view showing a semiconductor package 1000 according to some example embodiments of inventive concepts. FIG. 2 illustrates a cross-sectional view taken along line I-I' of FIG. 1.

Referring to FIGS. 1 and 2, a first semiconductor chip 300 and a second semiconductor chip 200 may be disposed on a substrate 100. The second semiconductor chip 200 may be disposed laterally spaced apart from the first semiconductor chip 300. According to some embodiments, a plurality of second semiconductor chips 200 may be placed on the substrate 100, and each of the plurality of second semiconductor chips 200 may be laterally spaced apart from the first semiconductor chip 300.

The substrate 100 may be, for example, an interposer substrate. The substrate 100 may include first substrate pads 110 on a top surface 100U of the substrate 100 and second substrate pads 120 on a bottom surface 100L of the substrate 100. The first substrate pads 110 may be electrically connected to the second substrate pads 120 through internal lines in the substrate 100. The substrate 100 may be provided on its bottom surface 100L with lower bumps 130, which are connected to corresponding second substrate pads 120. The first and second substrate pads 110 and 120 and the lower bumps 130 may include a conductive material.

The first semiconductor chip 300 may have a first surface 300S1 and a second surface 300S2 that are opposite to each other, and may include a circuit layer 320 and first chip pads 310 adjacent to the first surface 300S1. The circuit layer 320 may include integrated circuits. The first semiconductor chip 300 may be disposed to allow the first surface 300S1 to face the top surface 100U of the substrate 100. In this description, the first surface 300S1 of the first semiconductor chip 300 may be called a bottom surface of the first semiconductor chip 300, and the second surface 300S2 of the first semiconductor chip 300 may be called a top surface of the first semiconductor chip 300.

First bumps 360 may be disposed between the first semiconductor chip 300 and the substrate 100. The first bumps 360 may be placed between the first surface 300S1 of the first semiconductor chip 300 and the top surface 100U of the substrate 100, and may be connected to corresponding ones of the first substrate pads 110. The first bumps 360 may be connected to corresponding first chip pads 310 of the first semiconductor chip 300. The first semiconductor chip 300 may be electrically connected through the first bumps 360 to the substrate 100. The first bumps 360 may include a conductive material.

The second semiconductor chip 200 may have a first surface 200S1 and a second surface 200S2 that are opposite to each other. The second semiconductor chip 200 may be disposed to allow the first surface 200S1 to face the top surface 100U of the substrate 100. In this description, the first surface 200S1 of the second semiconductor chip 200 may be called a bottom surface of the second semiconductor chip 200, and the second surface 200S2 of the second semiconductor chip 200 may be called a top surface of the second semiconductor chip 200.

The second semiconductor chip 200 may include a plurality of sub-semiconductor chips 210, 220, and 230, and the plurality of sub-semiconductor chips 210, 220, and 230 may be stacked in a direction perpendicular to the top surface 100U of the substrate 100. In this case, the first surface 200S1 of the second semiconductor chip 200 may correspond to a bottom surface of a lowermost sub-semiconductor chip 210 among the plurality of sub-semiconductor chips 210, 220, and 230, and the second surface 200S2 of the second semiconductor chip 200 may correspond to a top surface of an uppermost sub-semiconductor chip 230 among the plurality of the sub-semiconductor chips 210, 220, and 230. The second semiconductor chip 200 may include through electrodes 250 that penetrate the plurality of sub-semiconductor chips 210, 220, and 230, and may further include connection bumps 240 between the plurality of sub-semiconductor chips 210, 220, and 230. The plurality of sub-semiconductor chip 210, 220, and 230 may be electrically connected to each other via the through electrodes 250 and the connection bumps 240. The through electrodes 250 and the connection bumps 240 may include a conductive material.

Second bumps 260 may be disposed between the second semiconductor chip 200 and the substrate 100. The second bumps 260 may be placed between the first surface 200S1 of the second semiconductor chip 200 and the top surface 100U of the substrate 100, and may be connected to corresponding ones of the first substrate pads 110. When the second semiconductor chip 200 includes the plurality of sub-semiconductor chips 210, 220, and 230, the second bumps 260 may be connected to corresponding through electrodes 250 that penetrate the lowermost sub-semiconductor chip 210 of the plurality of sub-semiconductor chips 210, 220, and 230. The second semiconductor chip 200 may be electrically connected through the second bumps 260 to the substrate 100. The second bumps 260 may include a conductive material.

The first and second semiconductor chips 300 and 200 may be different semiconductor chips from each other. For example, the first semiconductor chip 300 may be a logic chip, an application processor (AP) chip, or a system-on-chip (SOC), and the second semiconductor chip 200 may be a memory chip. When the second semiconductor chip 200 includes the plurality of sub-semiconductor chips 210, 220, and 230, the plurality of sub-semiconductor chips 210, 220, and 230 may include a plurality of memory chips. For example, the lowermost sub-semiconductor chip 210 of the plurality of sub-semiconductor chips 210, 220, and 230 may include a logic circuit, a memory circuit, or a combination thereof, and the rest of the plurality of sub-semiconductor chips 210, 220, and 230 may be the same memory chips as each other. The second memory chip 200 may be a high bandwidth memory (HBM) chip in which a plurality of memory chips (for example, the same memory chips as each other) are stacked.

The first semiconductor chip 300 may have a thickness 300T less than a thickness 200T of the second semiconductor chip 200. The second surface 300S2 (or the top surface) of the first semiconductor chip 300 may be located at a lower height than that of the second surface 200S2 (or the top surface) of the second semiconductor chip 200. When the second semiconductor chip 200 includes the plurality of sub-semiconductor chips 210, 220, and 230, the height of the second surface 300S2 (or the top surface) of the first semiconductor chip 300 may be less than that of the top surface of the uppermost sub-semiconductor chip 230 among the plurality of sub-semiconductor chips 210, 220, and 230. In this description, a "thickness" may be measured along a direction perpendicular to the top surface 100U of the substrate 100, and a "height" may be a distance measured from the top surface 100U of the substrate 100.

According to some embodiments, a dummy chip 400 may be stacked on the first semiconductor chip 300, and a dielectric layer 500 may be disposed between the first semiconductor chip 300 and the dummy chip 400. The dummy chip 400 may have a first surface 400S1 and a second surface 400S2 that are opposite to each other, and may be disposed to allow the first surface 400S1 to face the second surface 300S2 of the first semiconductor chip 300. In this description, the first surface 400S1 of the dummy chip 400 may be called a bottom surface of the dummy chip 400, and the second surface 400S2 of the dummy chip 400 may be called a top surface of the dummy chip 400. The dielectric layer 500 may be interposed between the second surface 300S2 of the first semiconductor chip 300 and the first surface 400S1 of the dummy chip 400, and may extend along the second surface 300S2 of the first semiconductor chip 300 and along the first surface 400S1 of the dummy chip 400. The second surface 400S2 of the dummy chip 400 may be located at a height substantially the same as that of the second surface 200S2 of the second semiconductor chip 200.

The dielectric layer 500 may provide direct-bonding between the first semiconductor chip 300 and the dummy chip 400. The dielectric layer 500 may include an inorganic dielectric material, for example, one or more of silicon oxide, silicon nitride, and silicon carbon nitride. The dielectric layer 500 may have a thickness 500T of about 1 μm or less. When the thickness T5 of the dielectric layer 500 is greater than about 1 μm, it may be difficult to discharge heat generated from the first semiconductor chip 300. The dummy chip 400 may be a semiconductor substrate with no circuit layer, such as a silicon substrate, a germanium substrate, or a silicon-germanium substrate. For example, the dummy chip 400 may be a bulk silicon substrate.

When a plurality of semiconductor chips are mounted on a single substrate, or the substrate 100, the semiconductor chips may be provided so their top surfaces contact use thermal conductive layers to discharge heat generated from the semiconductor chips. When the semiconductor chips have different thicknesses, the top surfaces of the semiconductor chips may be located at different heights, and in this case, it may be difficult to form the thermal conductive layers.

According to inventive concepts, the dummy chip 400 may be stacked on the first semiconductor chip 300, and the second surface 400S2 of the dummy chip 400 may be located at substantially the same height as that of the second surface 200S2 of the second semiconductor chip 200. For example, the dummy chip 400 may compensate for a difference in height between the second surface 300S2 of the first semiconductor chip 300 and the second surface 200S2 of the second semiconductor chip 200. Therefore, in a subsequent process, thermal conductive layers may be easily formed on the second surfaces 400S2 and 200S2 of the dummy chip 400 and the second semiconductor chip 200.

Furthermore, the first semiconductor chip 300 and the dummy chip 400 may be directly bonded to each other by the dielectric layer 500 that includes an inorganic dielectric material. In this case, the first semiconductor chip 300 and the dummy chip 400 may be easily bonded to each other in a wafer-level bonding process. In addition, because the dielectric layer 500 includes an inorganic dielectric material, it may be easy to discharge heat generated from the first semiconductor chip 300.

Accordingly, it may be possible to provide the semiconductor package 1000 in which a plurality of semiconductor chips are easily mounted and heat radiation is improved.

Figure 3:
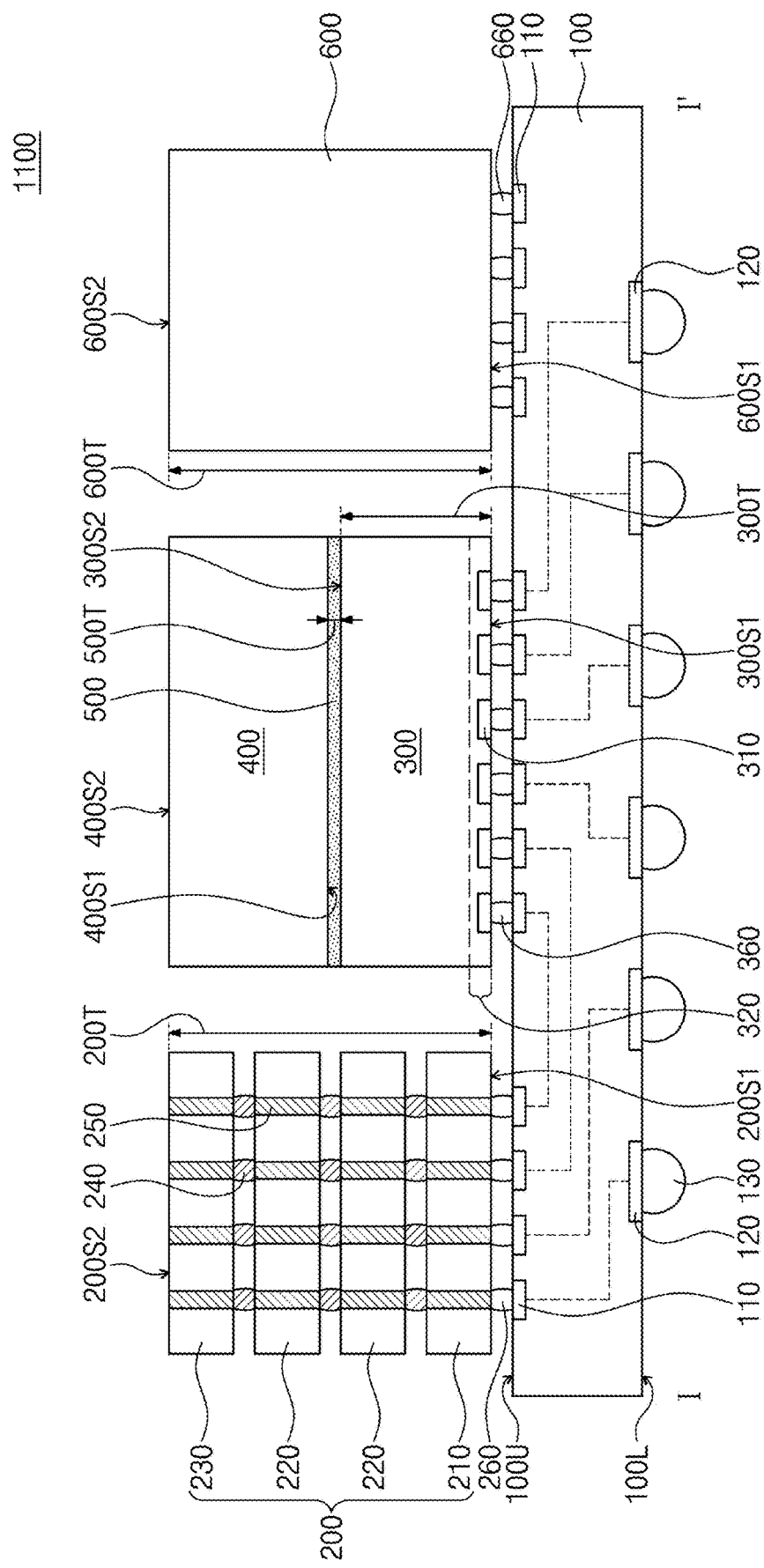
FIGS. 3 and 4 illustrate cross-sectional views taken along line I-I' of FIG. 1, each showing a semiconductor package according to some example embodiments of inventive concepts.
Figure 4:
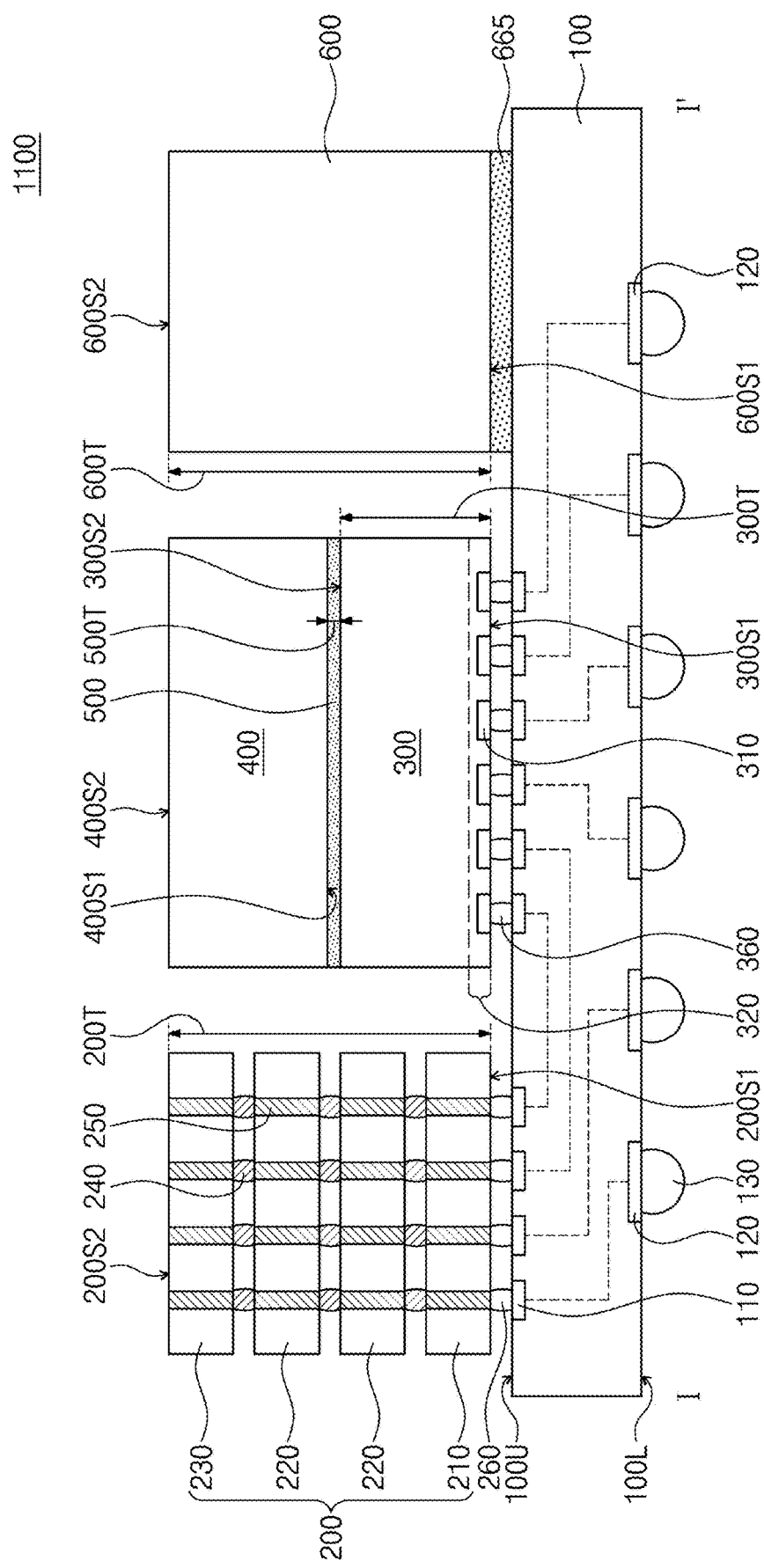

FIGS. 3 and 4 illustrate cross-sectional views taken along line I-I' of FIG. 1, each showing a semiconductor package 1100 according to some example embodiments of inventive concepts. For brevity of description, the following will focus on differences from the semiconductor package 1000 discussed with reference to FIGS. 1 and 2.

Referring to FIGS. 1, 3, and 4, according to some embodiments, a dummy semiconductor chip 600 may be disposed on the substrate 100. The dummy semiconductor chip 600 may be laterally spaced apart from the first semiconductor chip 300 and the second semiconductor chip 200. The dummy semiconductor chip 600 may have a first surface 600S1 and a second surface 600S2 that are opposite to each other, and may be disposed to allow the first surface 600S1 to face the top surface 100U of the substrate 100. In this description, the first surface 600S1 of the dummy semiconductor chip 600 may be called a bottom surface of the dummy semiconductor chip 600, and the second surface 600S2 of the dummy semiconductor chip 600 may be called a top surface of the dummy semiconductor chip 600.

According to some embodiments, as shown in FIG. 3, dummy bumps 660 may be disposed between the dummy semiconductor chip 600 and the substrate 100. The dummy bumps 660 may be placed between the first surface 600S1 of the dummy semiconductor chip 600 and the top surface 100U of the substrate 100, and may be connected to corresponding ones of the first substrate pads 110. The dummy semiconductor chip 600 may be attached through the dummy bumps 660 to the substrate 100. The dummy bumps 660 may include a conductive material, but inventive concepts are not limited thereto. The dummy bumps 660 may include the same material as that of the first and second bumps 360 and 260.

According to other embodiments, as shown in FIG. 4, an adhesive layer 665 may be disposed between the dummy semiconductor chip 600 and the substrate 100. The adhesive layer 665 may be placed between the first surface 600S1 of the dummy semiconductor chip 600 and the top surface 100U of the substrate 100. The dummy semiconductor chip 600 may be attached through the adhesive layer 665 to the substrate 100. The adhesive layer 665 may include an organic dielectric material.

Referring back to FIGS. 1, 3, and 4, the dummy semiconductor chip 600 may have a thickness 600T greater than the thickness 300T of the first semiconductor chip 300. The second surface 600S2 (or the top surface) of the dummy semiconductor chip 600 may be located at a height greater than that of the second surface 300S2 (or the top surface) of the first semiconductor chip 300. According to some embodiments, the height of the second surface 600S2 of the dummy semiconductor chip 600 may be substantially the same as that of the second surface 400S2 of the dummy chip 400 and that of the second surface 200S2 of the second semiconductor chip 200. The dummy semiconductor chip 600 may be a semiconductor chip with no circuit layer, such as a silicon substrate, a germanium substrate, or a silicon-germanium substrate. For example, the dummy semiconductor chip 600 may be a bulk silicon substrate.

According to the present embodiments, the first semiconductor chip 300, the second semiconductor chip 200, and the dummy semiconductor chip 600 may be mounted on a single substrate, or the substrate 100, and the dummy chip 400 may be stacked on the first semiconductor chip 300. The height of the second surface 600S2 of the dummy semiconductor chip 600 may be substantially the same as that of the second surface 400S2 of the dummy chip 400 and that of the second surface 200S2 of the second semiconductor chip 200. Accordingly, in a subsequent process, thermal conductive layers may be easily formed on the second surfaces 400S2, 200S2, and 600S2 of the dummy chip 400, the second semiconductor chip 200, and the dummy semiconductor chip 600.

Figure 5:
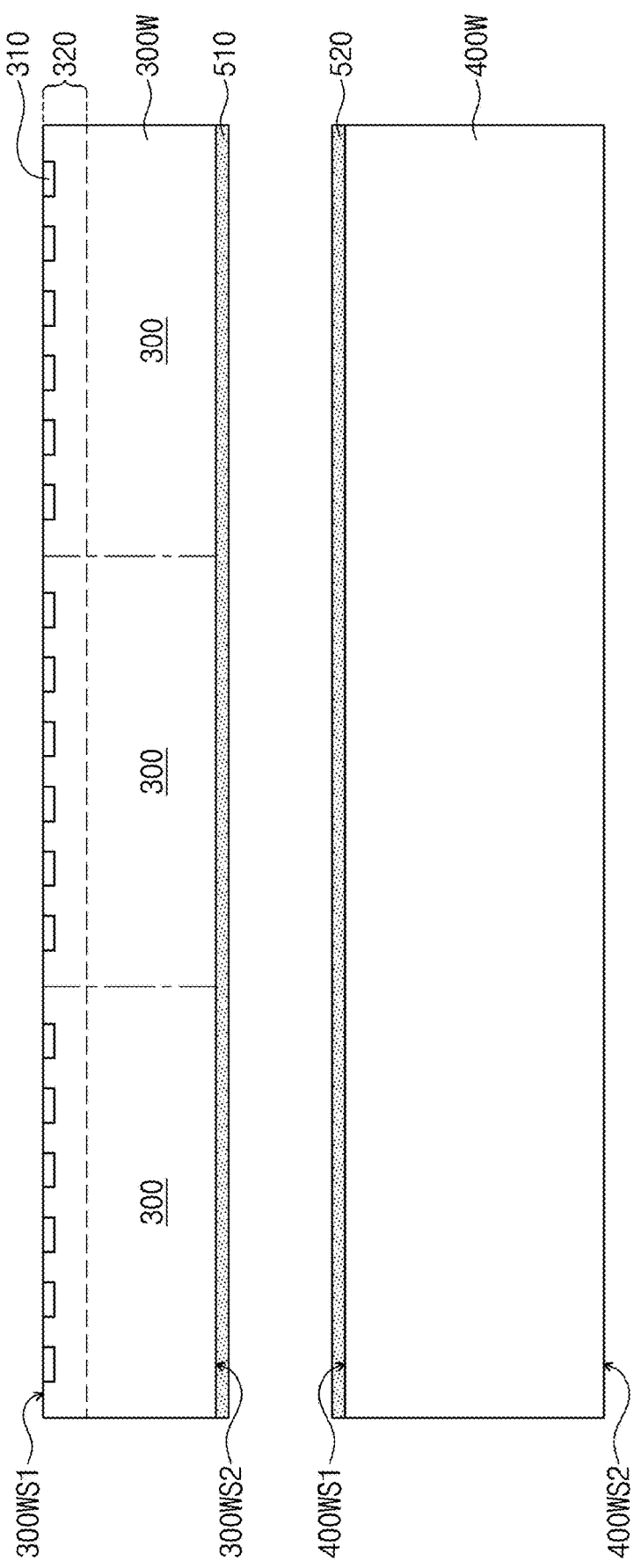
FIGS. 5 to 7 illustrate cross-sectional views showing a method of fabricating a semiconductor package according to some example embodiments of inventive concepts.
Figure 6:
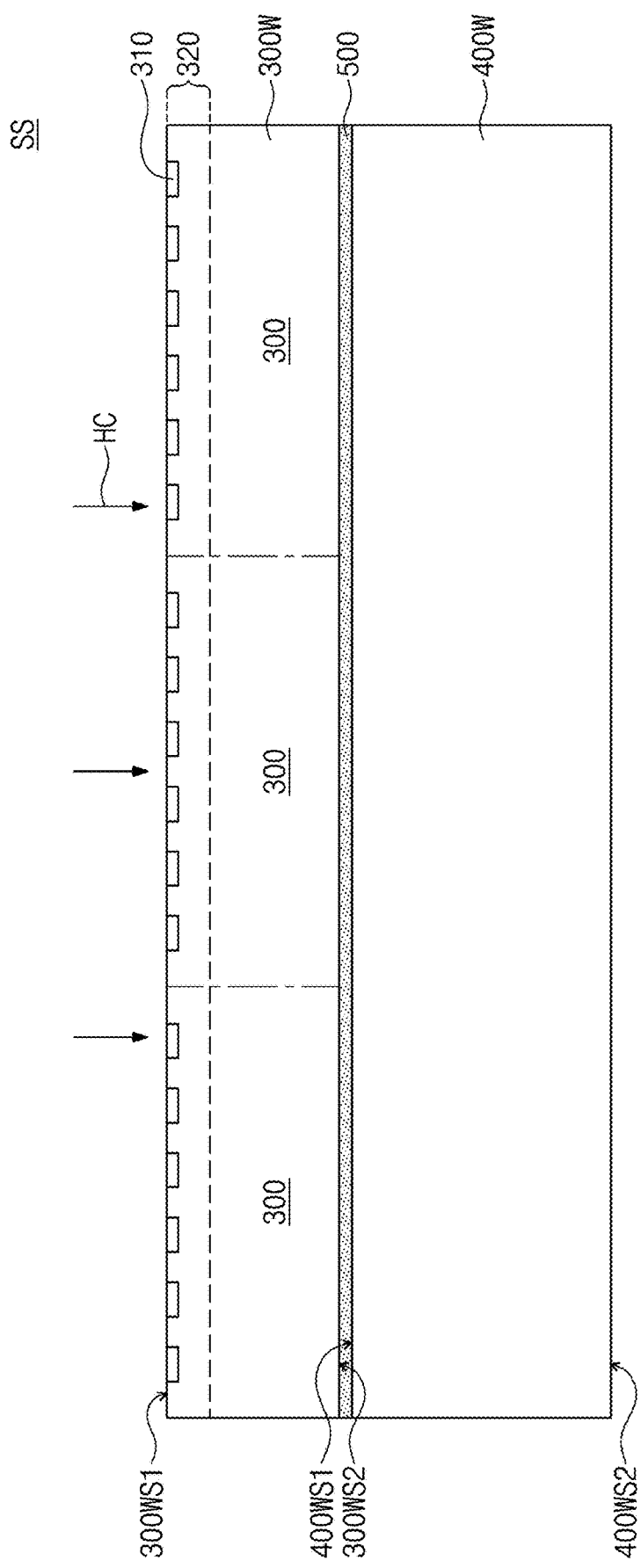
Figure 7:
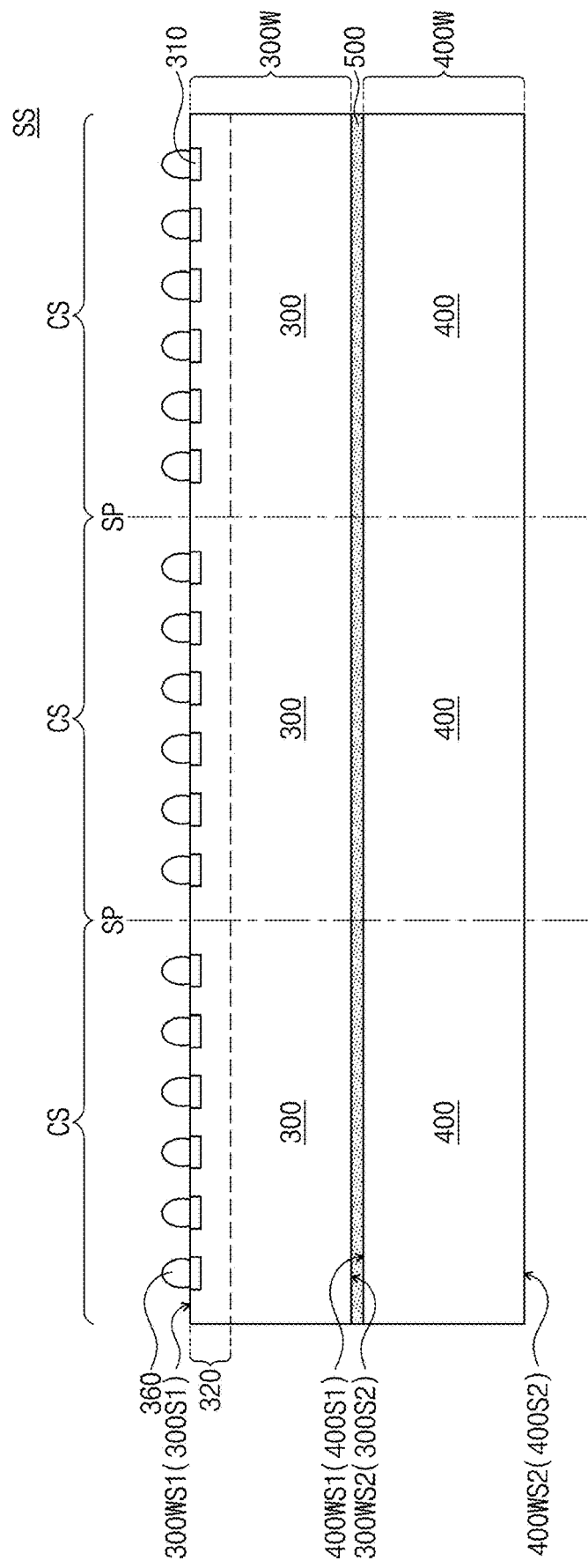

FIGS. 5 to 7 illustrate cross-sectional views showing a method of fabricating a semiconductor package according to some example embodiments of inventive concepts. For brevity of description, omission will be made to avoid duplicate explanation of the semiconductor packages 1000 and 1100 discussed with reference to FIGS. 1 to 4.

Referring to FIG. 5, a first wafer 300W including a plurality of first semiconductor chips 300 may be provided. The first wafer 300W may have a first surface 300WS1 and a second surface 300WS2 that are opposite to each other. Each of the plurality of first semiconductor chips 300 may include a circuit layer 320 and first chip pads 310, and the circuit layer 320 and the first chip pads 310 may be disposed adjacent to the first surface 300WS1 of the first wafer 300W. The circuit layer 320 may include integrated circuits.

A first dielectric layer 510 may be formed on the second surface 300WS2 of the first wafer 300W. The first dielectric layer 510 may include an inorganic dielectric material, for example, one or more of silicon oxide, silicon nitride, and silicon carbon nitride. According to some embodiments, the formation of the first dielectric layer 510 may include performing a deposition process to deposit the first dielectric layer 510 on the second surface 300WS2 of the first wafer 300W. The deposition process may be, for example, a chemical vapor deposition process. According to other embodiments, the first dielectric layer 510 may be a native oxide layer that is formed by a planarization process performed on the second surface 300WS2 of the first wafer 300W. The planarization process may be, for example, a chemical mechanical polishing process or an etch-back process.

A dummy wafer 400W may be provided. The dummy wafer 400W may have a first surface 400WS1 and a second surface 400WS2 that are opposite to each other. The dummy wafer 400W may be a semiconductor wafer with no circuit layer, such as a silicon substrate, a germanium substrate, or a silicon-germanium substrate. For example, the dummy wafer 400W may be a bulk silicon substrate.

A second dielectric layer 520 may be formed on the first surface 400WS1 of the dummy wafer 400W. The second dielectric layer 520 may include an inorganic dielectric material, for example, one or more of silicon oxide, silicon nitride, and silicon carbon nitride. The second dielectric layer 520 may be formed by substantially the same method used for forming the first dielectric layer 510.

The first wafer 300W may be provided on the first surface 400WS1 of the dummy wafer 400W. The first wafer 300W may be provided to allow the second surface 300WS2 thereof to face the first surface 400WS1 of the dummy wafer 400W. Therefore, the first dielectric layer 510 may be provided adjacent to the second dielectric layer 520.

Referring to FIG. 6, a thermocompression process HC may bond the first dielectric layer 510 to the second dielectric layer 520, thereby forming a dielectric layer 500. The dielectric layer 500 may provide direct-bonding between the first wafer 300W and the dummy wafer 400W. Thus, a bonded structure SS may be formed in which the first wafer 300W and the dummy wafer 400W are bonded to each other.

Referring to FIG. 7, after the formation of the bonded structure SS, first bumps 360 may be formed on the first surface 300WS1 of the first wafer 300W. The first bumps 360 may be connected to corresponding first chip pads 310 of each of the first semiconductor chips 300.

A sawing process SP may separate the bonded structure SS into a plurality of chip stacks CS. The sawing process SP may separate the first wafer 300W into the plurality of first semiconductor chips 300 and may also separate the dummy wafer 400W into a plurality of dummy chips 400. Each of the chip stacks CS may include the first semiconductor chip 300, the dummy chip 400, and the dielectric layer 500 between the first semiconductor chip 300 and the dummy chip 400. Each of the chip stacks CS may further include corresponding first bumps 360 formed on each of the first semiconductor chips 300.

The first surface 300WS1 of the first wafer 300W may correspond to a first surface 300S1 of each of the first semiconductor chips 300, and the second surface 300WS2 of the first wafer 300W may correspond to a second surface 300S2 of each of the first semiconductor chips 300. The first surface 400WS1 of the dummy wafer 400W may correspond to a first surface 400S1 of each of the dummy chips 400, and the second surface 400WS2 of the dummy wafer 400W may correspond to a second surface 400S2 of each of the dummy chips 400.

Referring back to FIGS. 1 and 2, a corresponding one of the chip stacks CS may be provided on a substrate 100. The substrate 100 may be, for example, an interposer substrate. The corresponding chip stack CS may be provided to allow the first surface 300S1 of the first semiconductor chip 300 to face a top surface 100U of the substrate 100. The corresponding chip stack CS may be mounted on the substrate 100, such that the first bumps 360 may contact corresponding first substrate pads 110. A second semiconductor chip 200 may be mounted on the substrate 100, and a semiconductor package 1000 may be constituted by the substrate 100, the second semiconductor chip 200, and the corresponding chip stack CS. According to some embodiments, as discussed with reference to FIGS. 3 and 4, a dummy semiconductor chip 600 may be provided on the substrate 100, and a semiconductor package 1100 may be constituted by the substrate 100, the second semiconductor chip 200, the corresponding chip stack CS, and the dummy semiconductor chip 600.

FIGS. 8 to 11 illustrate cross-sectional views showing a method of fabricating a semiconductor package according to some example embodiments of inventive concepts. For brevity of description, the following will focus on differences from the method of fabricating a semiconductor package discussed with reference to FIGS. 5 to 7.

Figure 8:
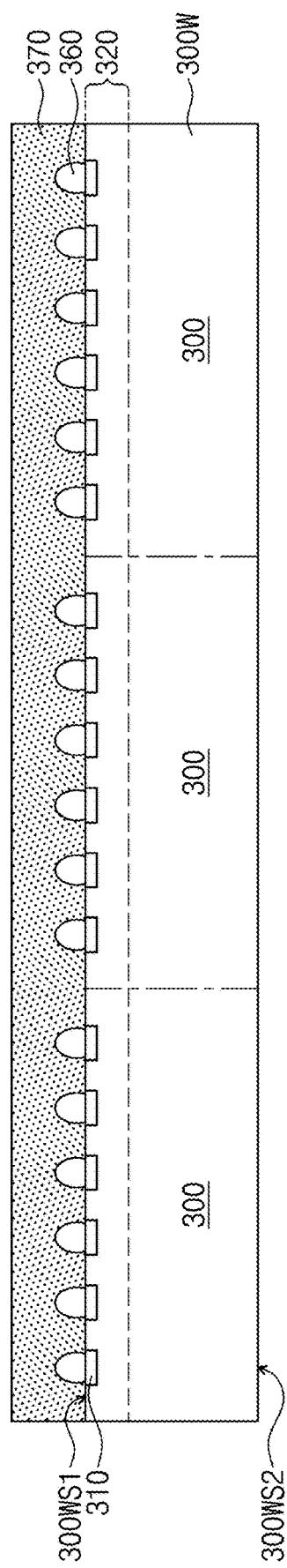
FIGS. 8 to 11 illustrate cross-sectional views showing a method of fabricating a semiconductor package according to some example embodiments of inventive concepts.

Referring to FIG. 8, a first wafer 300W including a plurality of first semiconductor chips 300 may be provided. The first wafer 300W may have a first surface 300WS1 and a second surface 300WS2 that are opposite to each other. Each of the plurality of first semiconductor chips 300 may include a circuit layer 320 and first chip pads 310, and the circuit layers 320 may be disposed adjacent to the first surface 300WS1 of the first wafer 300W. The circuit layers 320 may include integrated circuits.

First bumps 360 may be formed on the first surface 300WS1 of the first wafer 300W. The first bumps 360 may be connected to corresponding first chip pads 310 of each of the first semiconductor chips 300.

A protective film 370 may be formed on the first surface 300WS1 of the first wafer 300W and may cover the first bumps 360. The protective film 370 may include, for example, a dielectric resin.

Figure 9:
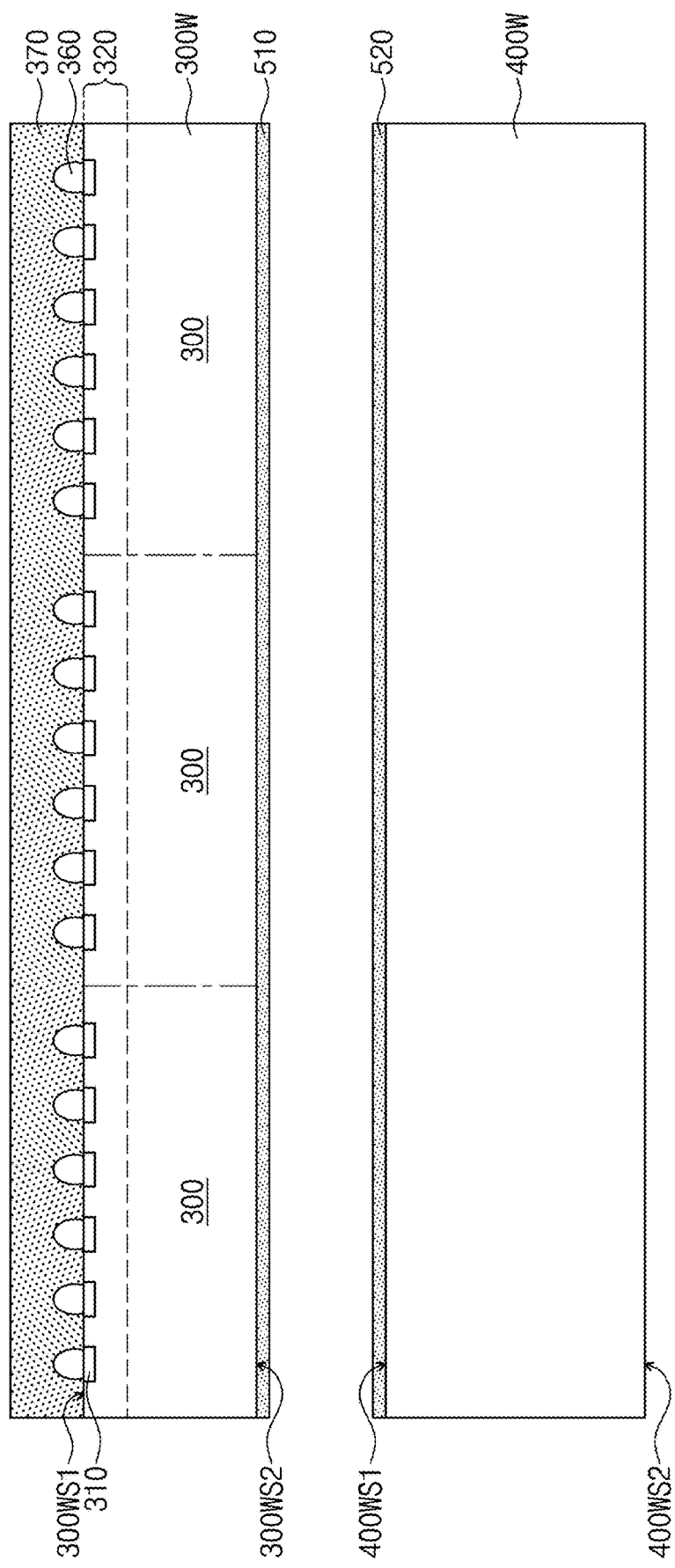

Referring to FIG. 9, a first dielectric layer 510 may be formed on the second surface 300WS2 of the first wafer 300W. The first dielectric layer 510 may include an inorganic dielectric material, for example, one or more of silicon oxide, silicon nitride, and silicon carbon nitride. The first dielectric layer 510 may be formed by substantially the same method used for forming the first dielectric layer 510 discussed with reference to FIG. 5.

A dummy wafer 400W may be provided. The dummy wafer 400W may have a first surface 400WS1 and a second surface 400WS2 that are opposite to each other, and a second dielectric layer 520 may be formed on the first surface 400WS1 of the dummy wafer 400W. The second dielectric layer 520 may include an inorganic dielectric material, for example, one or more of silicon oxide, silicon nitride, and silicon carbon nitride. The second dielectric layer 520 may be formed by substantially the same method used for forming the first dielectric layer 510.

The first wafer 300W may be provided on the first surface 400WS1 of the dummy wafer 400W. The first wafer 300W may be provided to allow the second surface 300WS2 thereof to face the first surface 400WS1 of the dummy wafer 400W. Therefore, the first dielectric layer 510 may be provided adjacent to the second dielectric layer 520.

Figure 10:
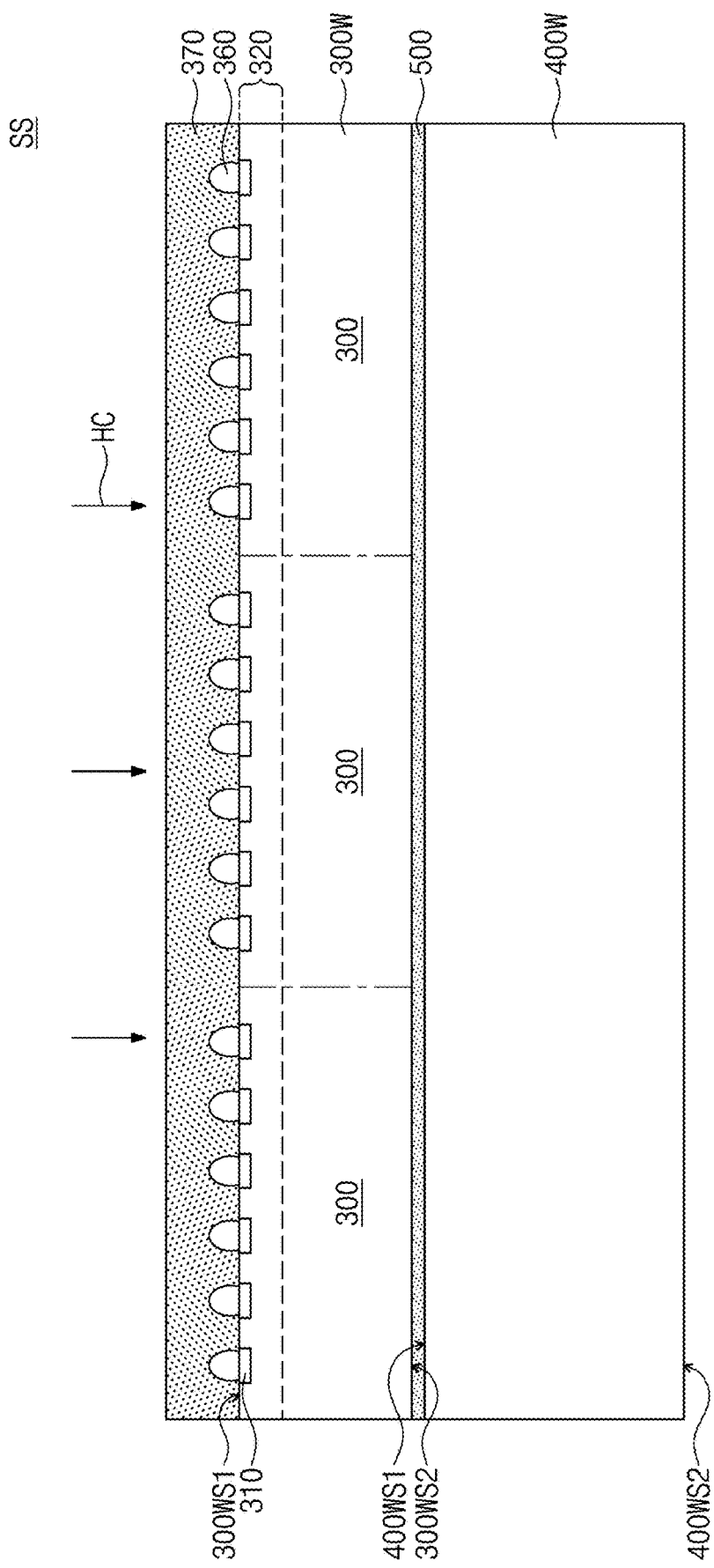

Referring to FIG. 10, a thermocompression process HC may bond the first dielectric layer 510 to the second dielectric layer 520, thereby forming a dielectric layer 500. According to the present embodiments, the protective film 370 may protect the first bumps 360 during the thermocompression process HC. The dielectric layer 500 may provide direct-bonding between the first wafer 300W and the dummy wafer 400W. Thus, a bonded structure SS may be formed in which the first wafer 300W and the dummy wafer 400W are bonded to each other.

Figure 11:
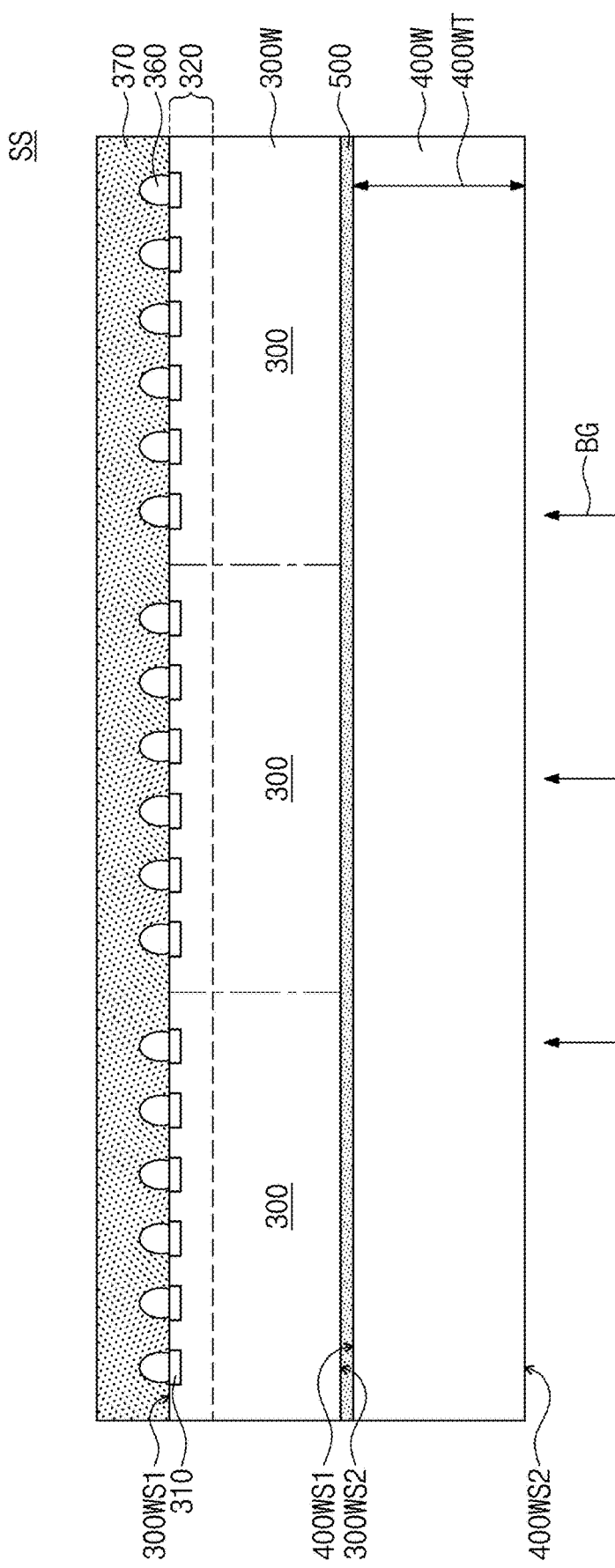

Referring to FIG. 11, after the formation of the bonded structure SS, a grinding process BG may be performed on the second surface 400WS2 of the dummy wafer 400W. The grinding process BG may cause the dummy wafer 400W to be processed to have a required thickness 400WT. Thereafter, the protective film 370 may be removed. Subsequent processes may be substantially the same as those discussed with reference to FIGS. 1, 2, and 5 to 7.

Figure 12:
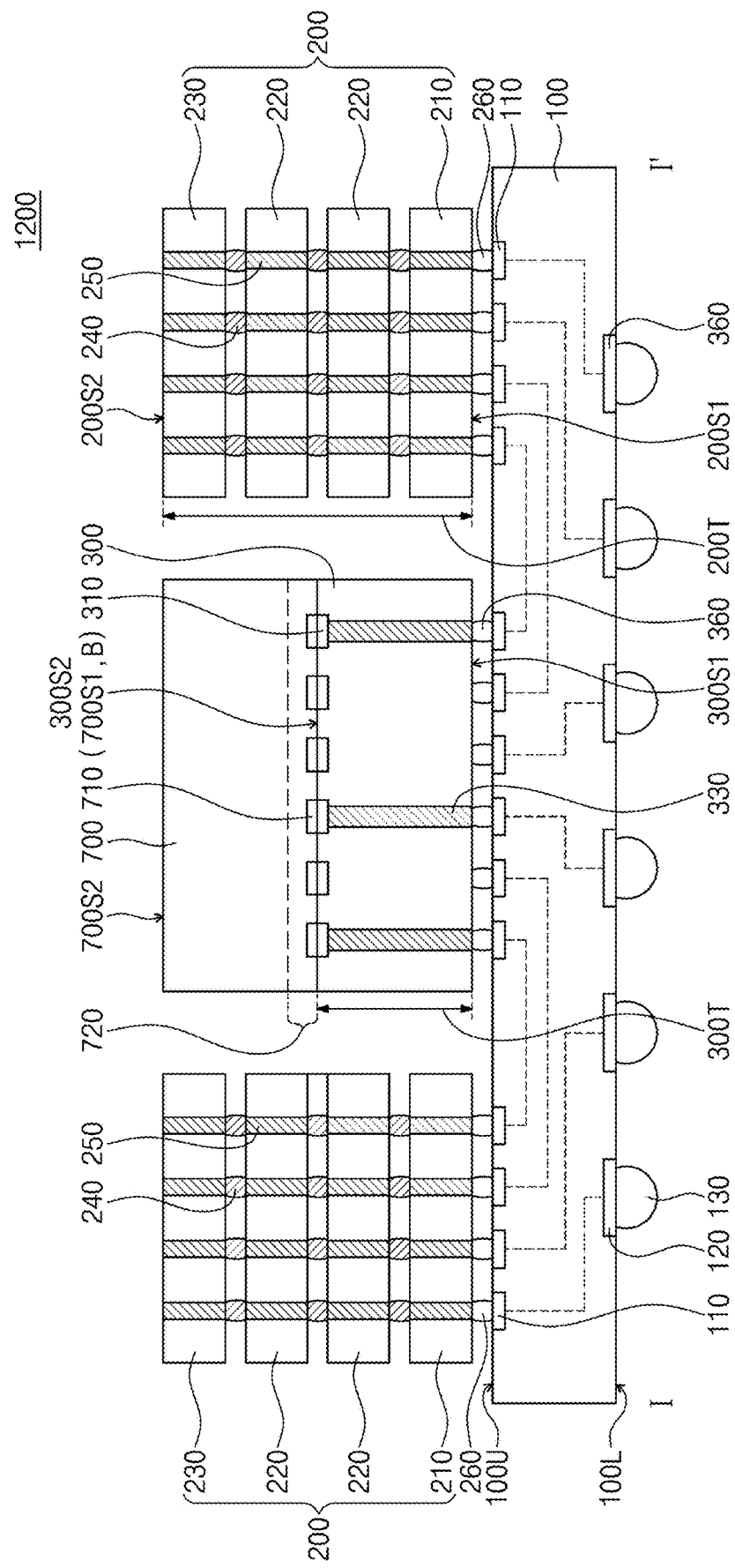
FIG. 12 illustrates a cross-sectional view taken along line I-I' of FIG. 1, showing a semiconductor package according to some example embodiments of inventive concepts.

FIG. 12 illustrates a cross-sectional view taken along line I-I' of FIG. 1, showing a semiconductor package 1200 according to some example embodiments of inventive concepts. For brevity of description, the following will focus on differences from the semiconductor package 1000 discussed with reference to FIGS. 1 and 2.

Referring to FIG. 12, a first semiconductor chip 300 and a second semiconductor chip 200 may be disposed on a substrate 100. The substrate 100 and the second semiconductor chip 200 may be substantially the same as the substrate 100 and the second semiconductor chip 200 that are discussed with reference to FIGS. 1 and 2.

The first semiconductor chip 300 may have a first surface 300S1 and a second surface 300S2 that are opposite to each other, and may be disposed to allow the first surface 300S1 to face a top surface 100U of the substrate 100. The first semiconductor chip 300 may include a circuit layer (not shown) adjacent to the first surface 300S1 or the second surface 300S2, and the circuit layer may include integrated circuits. The first semiconductor chip 300 may include first chip pads 310 adjacent to the second surface 300S2 and further include through electrodes 330 that penetrate an inside of the first semiconductor chip 300. The through electrodes 330 may be connected to corresponding ones of the first chip pads 310. At least one of the first chip pads 310 may be electrically separated from the through electrodes 330. The first chip pads 310 and the through electrodes 330 may include a conductive material.

First bumps 360 may be disposed between the first semiconductor chip 300 and the substrate 100. The through electrodes 330 of the first semiconductor chip 300 may be connected to corresponding ones of the first bumps 360, and the first semiconductor chip 300 may be electrically connected through the first bumps 360 to the substrate 100.

According to some embodiments, an upper semiconductor chip 700 may be stacked on the first semiconductor chip 300. The upper semiconductor chip 700 may have a first surface 700S1 and a second surface 700S2 that are opposite to each other, and may be disposed to allow the first surface 700S1 to face the second surface 300S2 of the first semiconductor chip 300. In this description, the first surface 700S1 of the upper semiconductor chip 700 may be called a bottom surface of the upper semiconductor chip 700, and the second surface 700S2 of the upper semiconductor chip 700 may be called a top surface of the upper semiconductor chip 700.

The upper semiconductor chip 700 may include a circuit layer 720 adjacent to the first surface 700S1. The circuit layer 720 may include integrated circuits. The upper semiconductor chip 700 may include second chip pads 710 adjacent to the first surface 700S1. The second chip pads 710 may be connected to corresponding first chip pads 310. The second chip pads 710 may be directly connected to the first chip pads 310, and for example, may be in directly contact with the first chip pads 310. The second chip pads 710 may include a conductive material.

The first and second chip pads 310 and 710 may provide direct-bonding between the first semiconductor chip 300 and the upper semiconductor chip 700. In this case, the first surface 700S1 of the upper semiconductor chip 700 and the second surface 300S2 of the first semiconductor chip 300 may be in contact with each other to constitute a boundary B. The boundary B between the upper semiconductor chip 700 and the first semiconductor chip 300 may include an inorganic dielectric material (e.g., silicon oxide) between the first chip pads 310 and between the second chip pads 710.

The second surface 700S2 (or the top surface) of the upper semiconductor chip 700 may be located at substantially the same height as that of the second surface 200S2 of the second semiconductor chip 200. The upper semiconductor chip 700 may be a logic chip, an application processor (AP) chip, a memory chip, or a system-on-chip (SOC). The upper semiconductor chip 700 may be electrically connected to the first semiconductor chip 300 through the first and second chip pads 310 and 710, and may also be electrically connected to the substrate 100 via the through electrodes 330 and the first bumps 360.

According to the present embodiments, the upper semiconductor chip 700 may be stacked on the first semiconductor chip 300, and the height of the second surface 700S2 (or the top surface) of the upper semiconductor chip 700 may be substantially the same as that of the second surface 200S2 of the second semiconductor chip 200. For example, the upper semiconductor chip 700 may compensate for a difference in height between the second surface 300S2 of the first semiconductor chip 300 and the second surface 200S2 of the second semiconductor chip 200. Therefore, in a subsequent process, thermal conductive layers may be easily formed on the second surfaces 700S2 and 200S2 of the upper semiconductor chip 700 and the second semiconductor chip 200.

The first and second chip pads 310 and 710 may provide direct-bonding between the first semiconductor chip 300 and the upper semiconductor chip 700. In this case, the first semiconductor chip 300 and the upper semiconductor chip 700 may be easily bonded to each other in a wafer-level bonding process. In addition, at least one of the first chip pads 310 of the first semiconductor chip 300 may be electrically separated from the through electrodes 330, and in this case, the at least one first chip pad 310 and its connected second chip pad 710 may be used as a pathway along which is discharged heat generated from the first semiconductor chip 300. Accordingly, it may be easy to discharge heat generated from the first semiconductor chip 300.

The semiconductor package 1200 according to the present embodiment may be substantially the same as the semiconductor package 1000 discussed above with reference to FIGS. 1 and 2, except for the differences previously mentioned.

Figure 13:
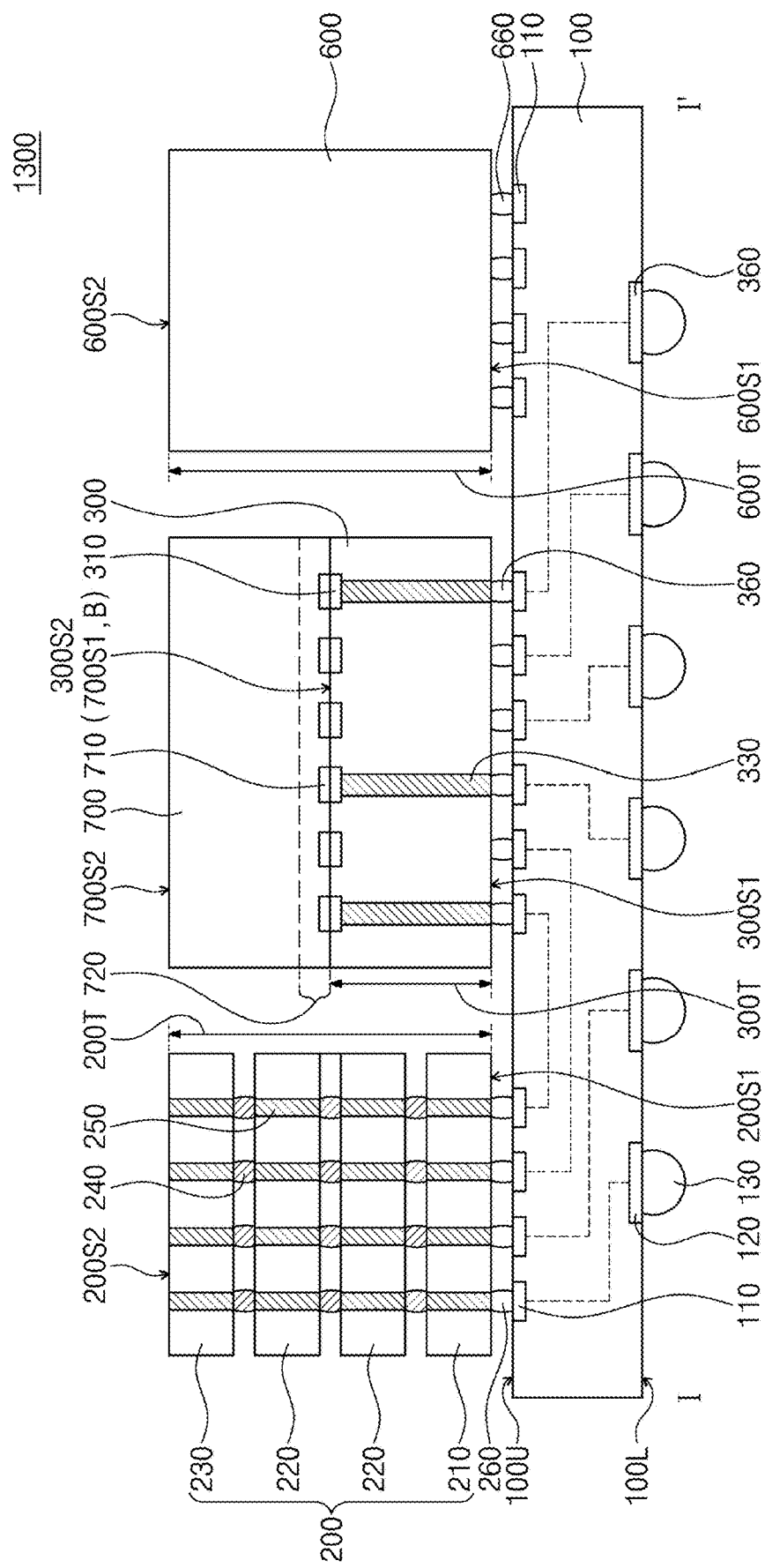
FIGS. 13 and 14 illustrate cross-sectional views taken along line I-I' of FIG. 1, each showing a semiconductor package according to some example embodiments of inventive concepts.
Figure 14:
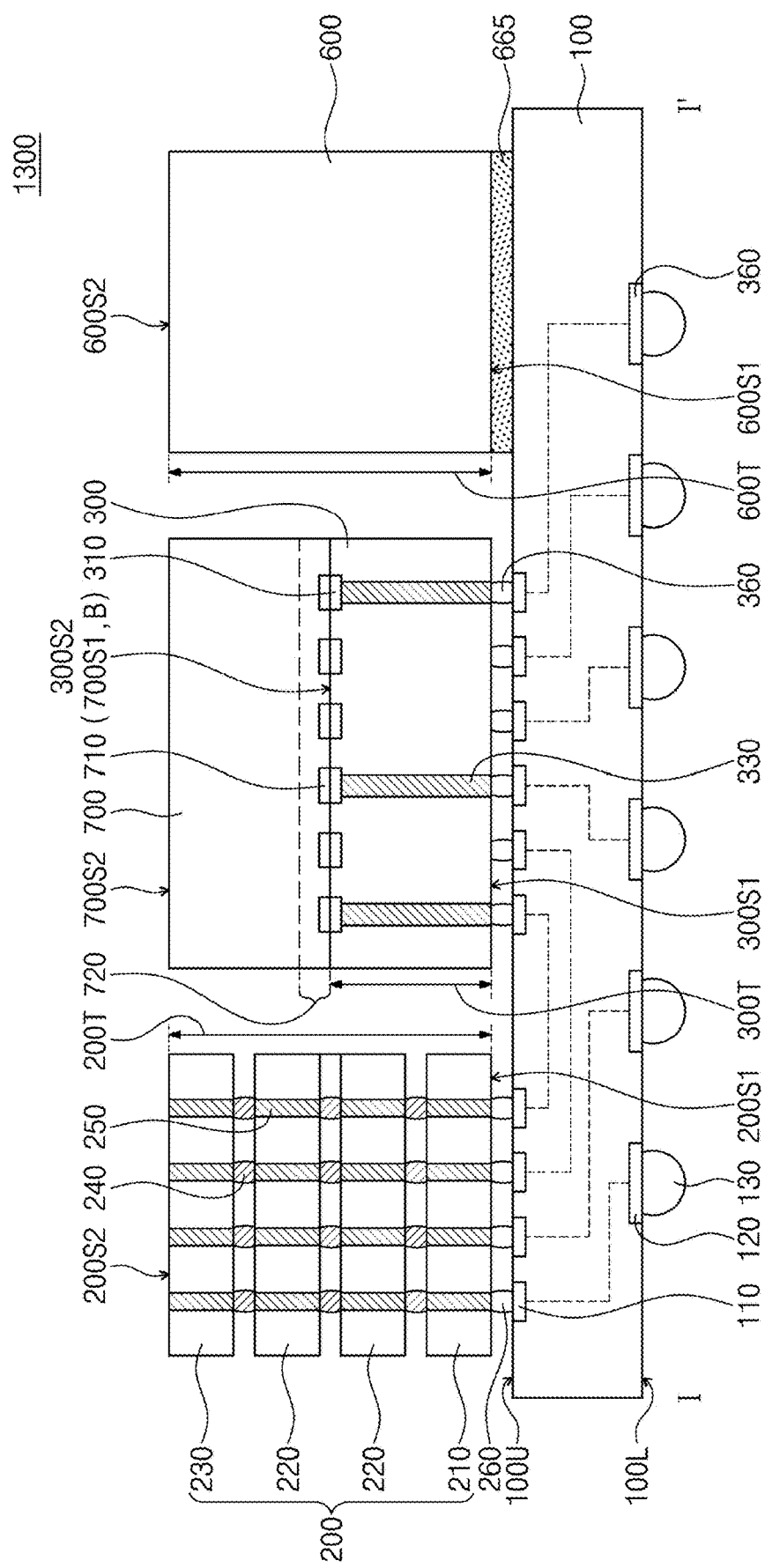

FIGS. 13 and 14 illustrate cross-sectional views taken along line I-I' of FIG. 1, each showing a semiconductor package 1300 according to some example embodiments of inventive concepts.

Referring to FIGS. 1, 13, and 14, according to some embodiments, a dummy semiconductor chip 600 may be disposed on the substrate 100. The dummy semiconductor chip 600 may be disposed laterally spaced apart from the first semiconductor chip 300 and the second semiconductor chip 200. The dummy semiconductor chip 600 may be substantially the same as the dummy semiconductor chip 600 discussed with reference to FIGS. 1, 3, and 4. The semiconductor package 1300 according to the present embodiment may be substantially the same as the semiconductor package 1200 discussed with reference to FIGS. 1 and 12, except for the differences previously mentioned.

Figure 15:
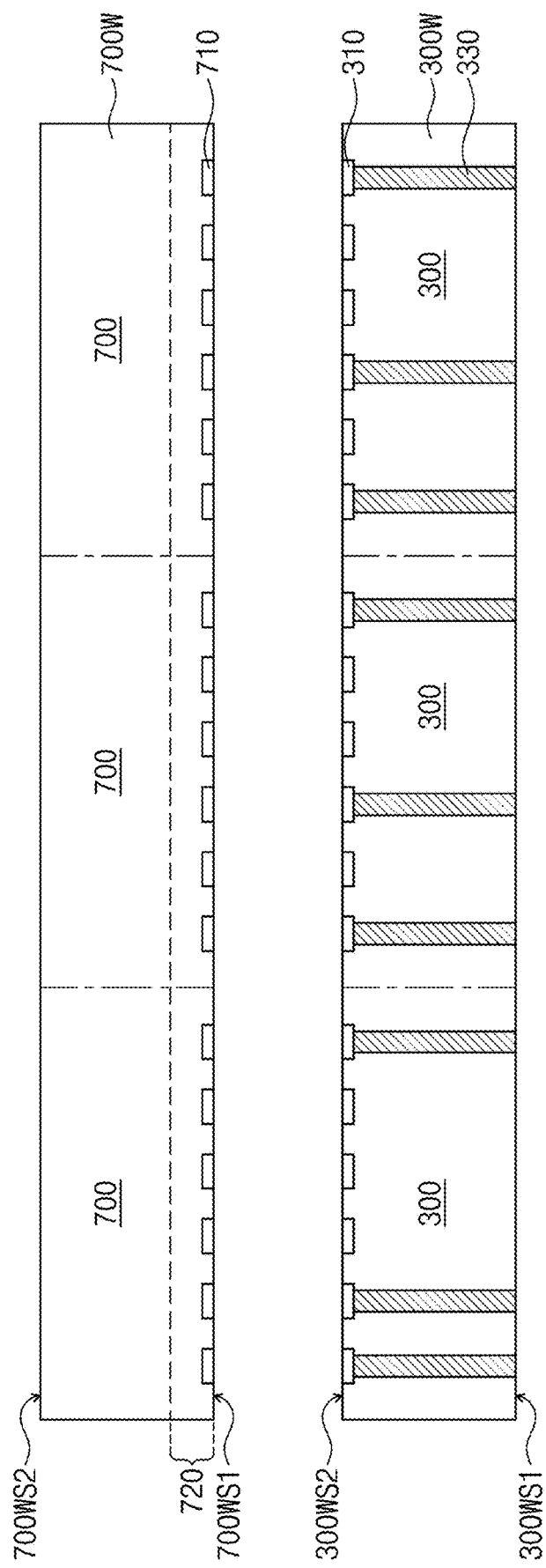
FIGS. 15 and 16 illustrate cross-sectional views showing a method of fabricating a semiconductor package according to some example embodiments of inventive concepts.
Figure 16:
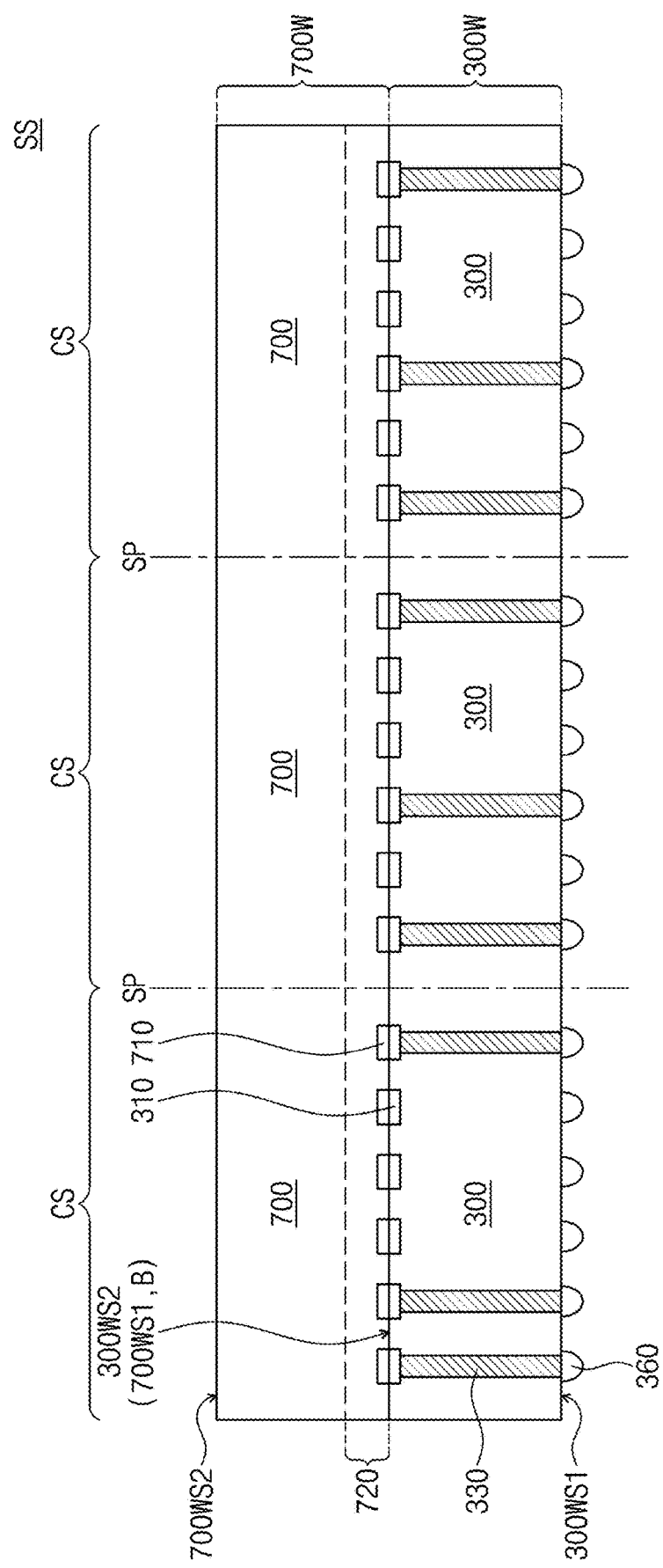

FIGS. 15 and 16 illustrate cross-sectional views showing a method of fabricating a semiconductor package according to some example embodiments of inventive concepts. For brevity of description, omission will be made to avoid duplicate explanations of the semiconductor packages 1200 and 1300 discussed with reference to FIGS. 1 and 12 to 14.

Referring to FIG. 15, a first wafer 300W including a plurality of first semiconductor chips 300 may be provided. The first wafer 300W may have a first surface 300WS1 and a second surface 300WS2 that are opposite to each other. Each of the plurality of first semiconductor chips 300 may include a circuit layer (not shown) adjacent to the first surface 300WS1 or the second surface 300WS, and the circuit layer may include integrated circuits. Each of the plurality of first semiconductor chips 300 may include first chip pads 310 adjacent to the second surface 300WS2 of the first wafer 300W, and may further include through electrodes 330 that penetrate an inside of the first semiconductor chip 300.

An upper wafer 700W including a plurality of upper semiconductor chips 700 may be provided. The upper wafer 700W may have a first surface 700WS1 and a second surface 700WS2 that are opposite to each other. The plurality of upper semiconductor chips 700 may include corresponding circuit layers 720, and the circuit layers 720 may be disposed adjacent to the first surface 700WS1 of the upper wafer 700W. The circuit layers 720 may include integrated circuits. Each of the upper semiconductor chips 700 may include second chip pads 710 adjacent to the first surface 700WS1 of the upper wafer 700W.

The upper wafer 700W may be provided on the second surface 300WS2 of the first wafer 300W. The upper wafer 700W may be provided to allow the first surface 700WS1 thereof to face the second surface 300WS2 of the first wafer 300W. Therefore, the second chip pads 710 may be provided adjacent to the first chip pads 310.

Referring to FIG. 16, a thermocompression process may bond the first chip pads 310 to the second chip pads 710. The first and second chip pads 310 and 710 may provide direct-bonding between the first wafer 300W and the upper wafer 700W, and as a result, a bonded structure SS may be formed in which the first wafer 300W and the upper wafer 700W are bonded to each other. In this case, the first surface 700WS1 of the upper wafer 700W and the second surface 300S2 of the first semiconductor chip 300 may be in contact with each other to constitute a boundary B. The boundary B between the upper wafer 700W and the first wafer 300W may include an inorganic dielectric material (e.g., silicon oxide) between the first chip pads 310 and between the second chip pads 710.

After the formation of the bonded structure SS, first bumps 360 may be formed on the first surface 300WS1 of the first wafer 300W. The through electrodes 330 of each of the plurality of first semiconductor chips 300 may be connected to corresponding ones of the first bumps 360.

A sawing process SP may separate the bonded structure SS into a plurality of chip stacks CS. The sawing process SP may separate the first wafer 300W into the plurality of first semiconductor chips 300, and may also separate the upper wafer 700W into the plurality of upper semiconductor chips 700. Each of the chip stacks CS may include the first semiconductor chip 300, the upper semiconductor chip 700, and corresponding first bumps 360 formed on each of the first semiconductor chips 300.

Referring back to FIGS. 1 and 12, a corresponding one of the chip stacks CS may be provided on a substrate 100. The corresponding chip stack CS may be mounted on the substrate 100, such that the first bumps 360 may contact corresponding first substrate pads 110. A second semiconductor chip 200 may be mounted on the substrate 100, and a semiconductor package 1200 may be constituted by the substrate 100, the second semiconductor chip 200, and the corresponding chip stack CS. According to some embodiments, as discussed with reference to FIGS. 13 and 14, a dummy semiconductor chip 600 may be provided on the substrate 100, and a semiconductor package 1300 may be constituted by the substrate 100, the second semiconductor chip 200, the corresponding chip stack CS, and the dummy semiconductor chip 600.

Figure 17:
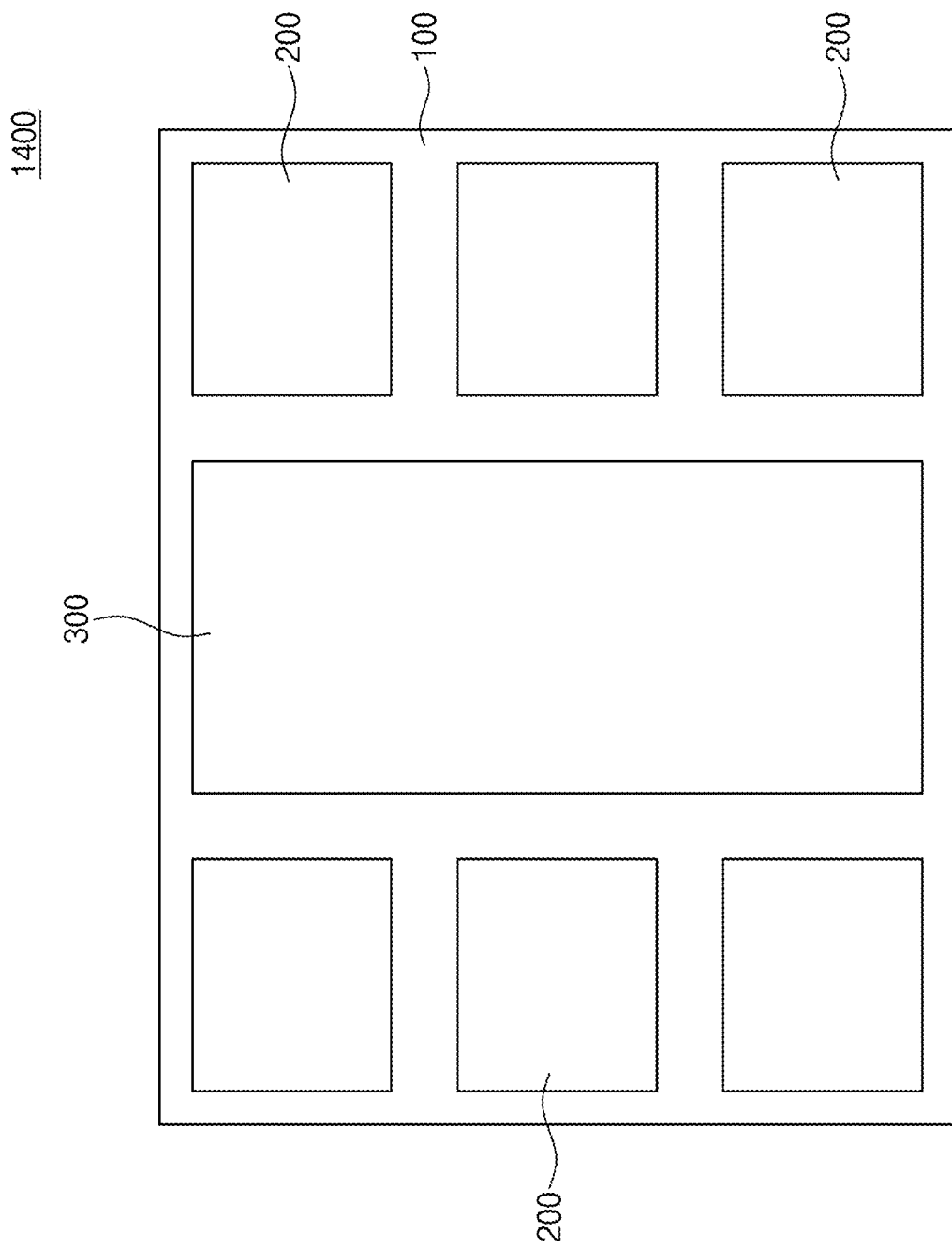
FIG. 17 illustrates a plan view showing a semiconductor package according to some example embodiments of inventive concepts.

FIG. 17 illustrates a plan view showing a semiconductor package 1400 according to some example embodiments of inventive concepts.

Referring to FIG. 17, a first semiconductor chip 300 and a plurality of second semiconductor chips 200 may be disposed on a substrate 100. Each of the plurality of second semiconductor chips 200 may be laterally spaced apart from the first semiconductor chip 300. The semiconductor package 1400 according to the present embodiments may be configured substantially identical to the semiconductor packages 1000, 1100, 1200, and 1300 discussed with reference to FIGS. 1 to 4 and 12 to 14, except for the number of the second semiconductor chips 200 or a planar arrangement of the first and second semiconductor chips 300 and 200.

Figure 18:
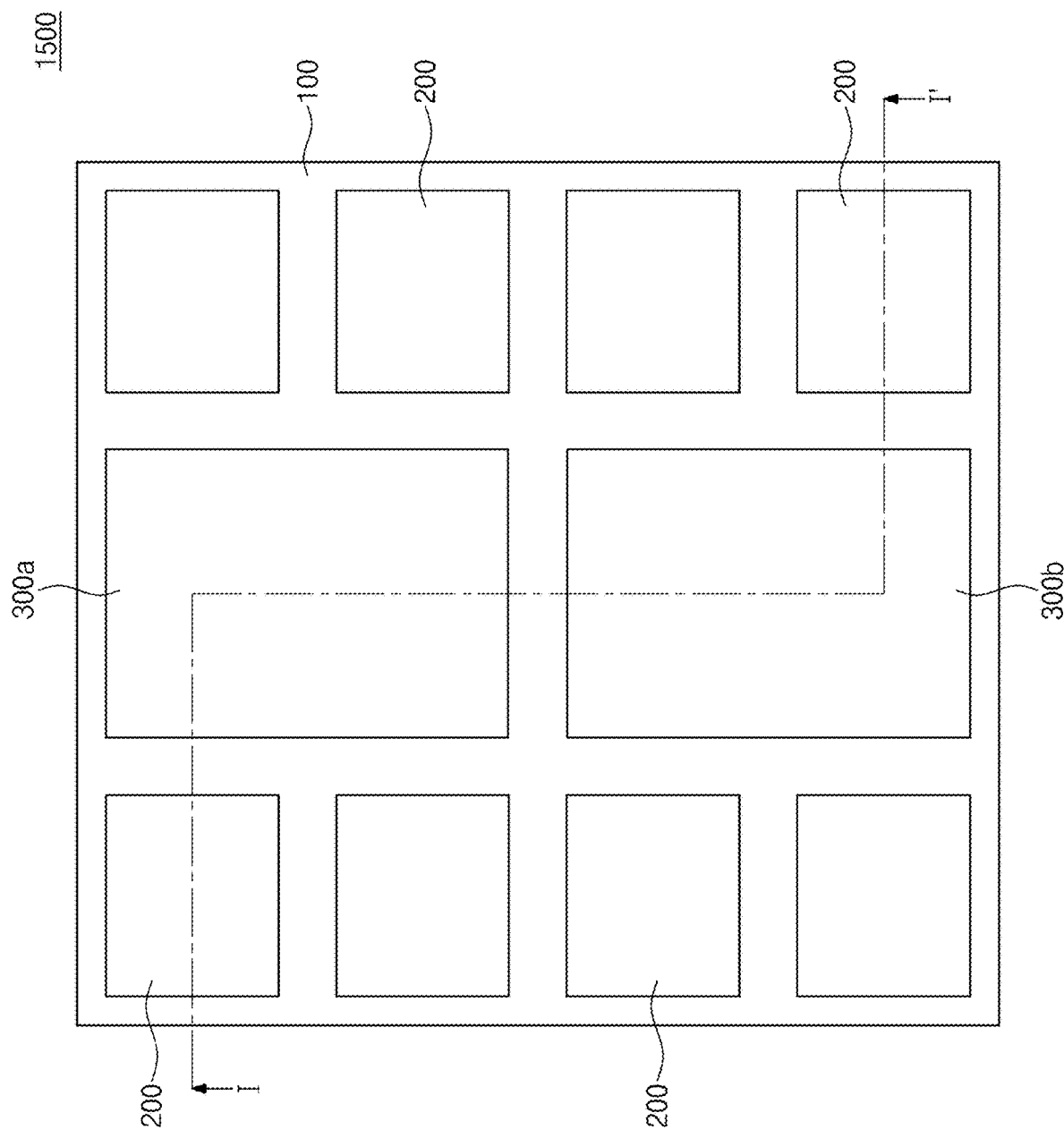
FIG. 18 illustrates a plan view showing a semiconductor package according to some example embodiments of inventive concepts.
Figure 19:
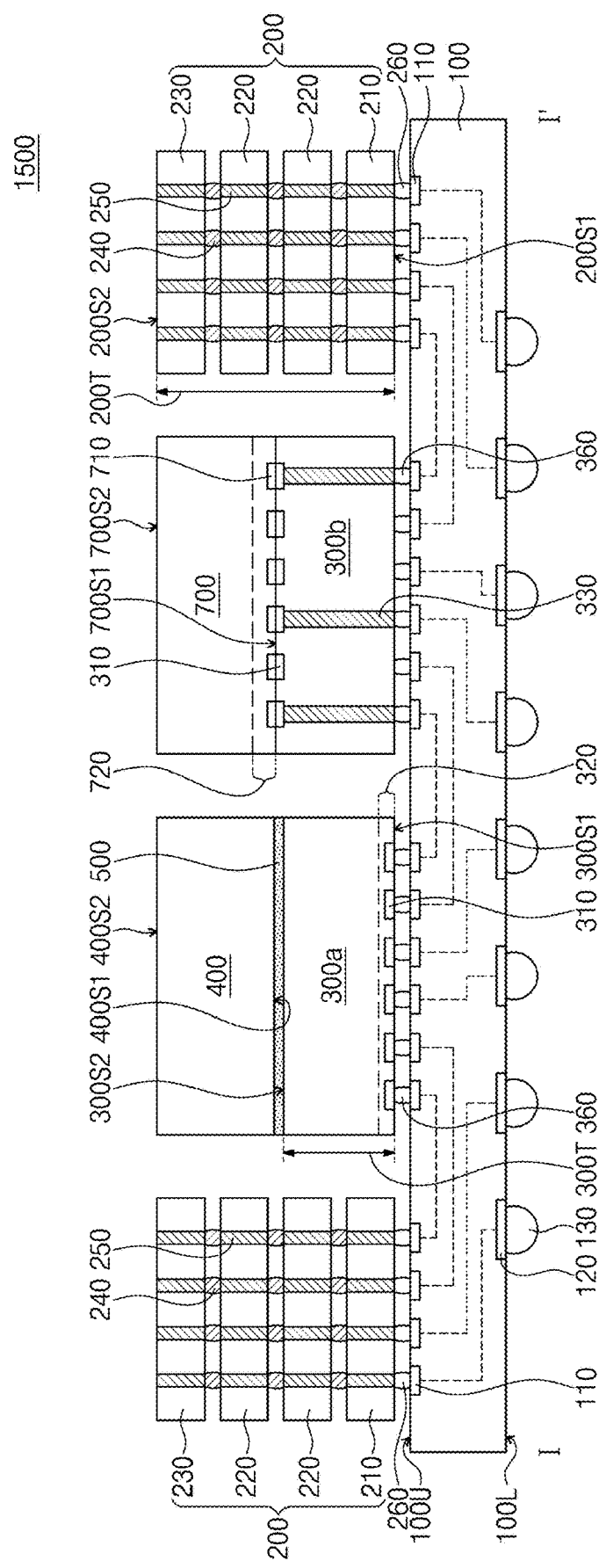
FIG. 19 illustrates a cross-sectional view taken along line I-I' of FIG. 18.

FIG. 18 illustrates a plan view showing a semiconductor package 1500 according to some example embodiments of inventive concepts. FIG. 19 illustrates a cross-sectional view taken along line I-I' of FIG. 18. For brevity of description, the following will focus on differences from the semiconductor package 1000 discussed above with reference to FIGS. 1 and 2.

Referring to FIGS. 18 and 19, a substrate 100 may be provided thereon with a first semiconductor chip 300a, a second semiconductor chip 200, and a third semiconductor chip 300b. According to some embodiments, each of the first and third semiconductor chips 300a and 300b may be laterally spaced apart from the second semiconductor chip 200. The substrate 100 and the second semiconductor chip 200 may be substantially the same as the substrate 100 and the second semiconductor chip 200 that are discussed with reference to FIGS. 1 and 2.

A dummy chip 400 may be stacked on the first semiconductor chip 300a, and an upper semiconductor chip 700 may be stacked on the third semiconductor chip 300b. The first semiconductor chip 300 and the dummy chip 400 may be directly bonded to each other by a dielectric layer 500 interposed therebetween. The first semiconductor chip 300a and the dummy chip 400 may be substantially the same as the first semiconductor chip 300 and the dummy chip 400 that are discussed with reference to FIGS. 1 and 2. The third semiconductor chip 300b and the upper semiconductor chip 700 may be directly bonded to each other by first chip pads 310 of the third semiconductor chip 300b and by second chip pads 710 of the upper semiconductor chip 700. The third semiconductor chip 300b and the upper semiconductor chip 700 may be substantially the same as the first semiconductor chip 300 and the upper semiconductor chip 700 that are discussed with reference to FIGS. 1 and 12.

According to the present embodiments, the semiconductor package 1500 may be constituted by the substrate 100 on which are stacked the first semiconductor chip 300a, the dummy chip 400 stacked on the first semiconductor chip 300a, the second semiconductor chip 200, the third semiconductor chip 300b, and the upper semiconductor chip 700 stacked on the third semiconductor chip 300b.

Figure 20:
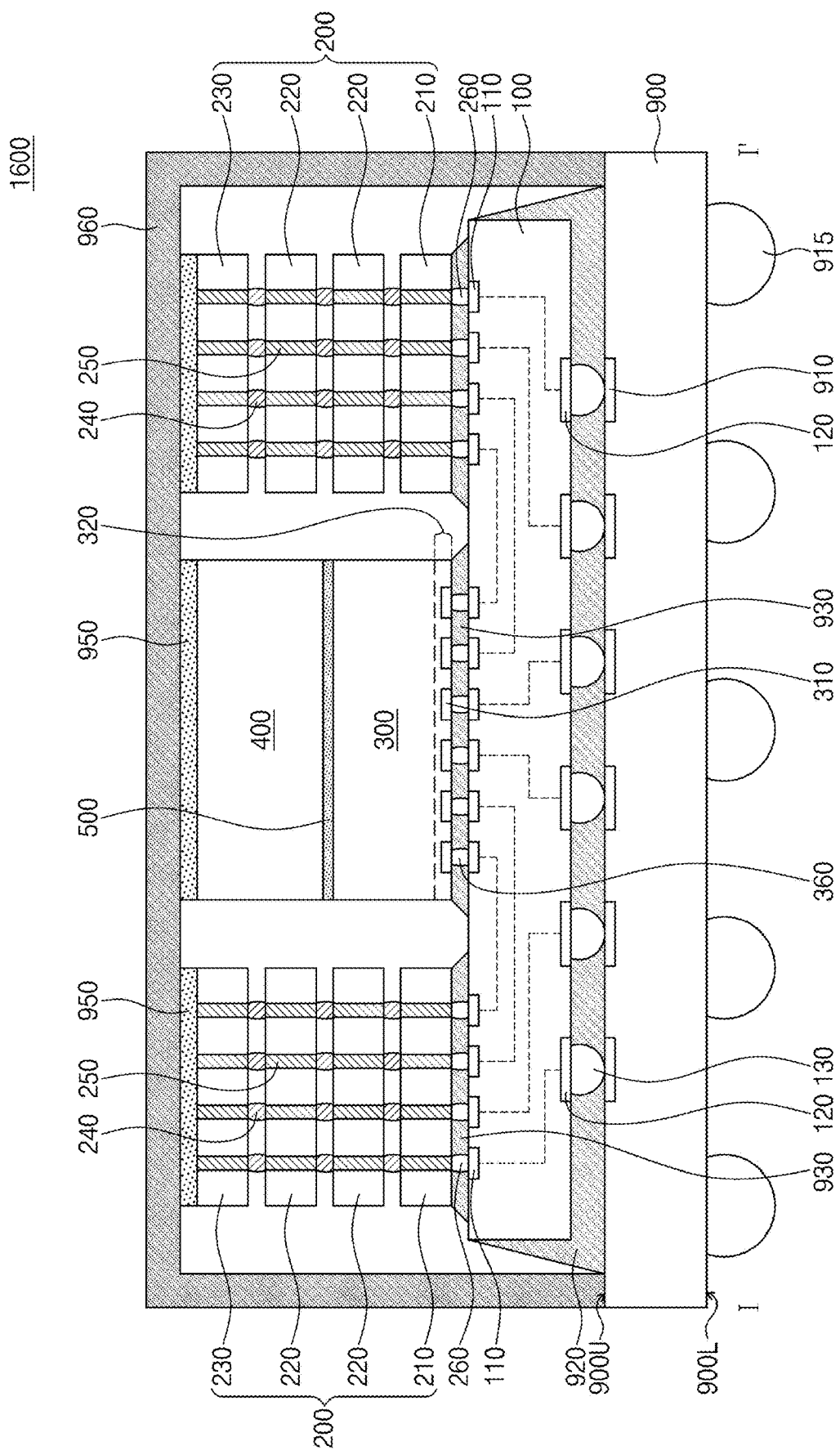
FIG. 20 illustrates a cross-sectional view showing a semiconductor package according to some example embodiments of inventive concepts.

FIG. 20 illustrates a cross-sectional view showing a semiconductor package 1600 according to some example embodiments of inventive concepts. For brevity of description, the following will focus on differences from the semiconductor package 1000 discussed above with reference to FIGS. 1 and 2.

Referring to FIG. 20, a second substrate 100 may be disposed on a first substrate 900.

The first substrate 900 may be, for example, a printed circuit board. The first substrate 900 may include conductive pads 910, and the conductive pads 910 may be disposed adjacent to a top surface 900U of the first substrate 900. External terminals 915 may be disposed on a bottom surface 900L of the first substrate 900, and the conductive pads 910 may be electrically connected to the external terminals 915 through internal lines in the first substrate 900.

The second substrate 100 may be disposed on the top surface 900U of the first substrate 900. The second substrate 100 may be substantially the same as the substrate 100 discussed with reference to FIGS. 1 and 2. The second substrate 100 may be electrically connected through lower bumps 130 to the first substrate 900. The lower bumps 130 may be connected to corresponding conductive pads 910. A lower under-fill layer 920 may be provided between the first substrate 900 and the second substrate 100, and may cover the lower bumps 130. The lower under-fill layer 920 may include a dielectric resin.

A first semiconductor chip 300 and a second semiconductor chip 200 may be disposed on the second substrate 100. The first semiconductor chip 300 and the second semiconductor chip 200 may be substantially the same as the first semiconductor chip 300 and the second semiconductor chip 200 that are discussed with reference to FIGS. 1 and 2. The first semiconductor chip 300 may be electrically connected to the second substrate 100 through first bumps 360, and the second semiconductor chip 200 may be electrically connected to the second substrate 100 through second bumps 260.

An upper under-fill layer 930 may be provided between the first semiconductor chip 300 and the second substrate 100, thereby covering the first bumps 360, and may also be provided the second semiconductor chip 200 and the second substrate 100, thereby covering the second bumps 260. The upper under-fill layer 930 may include a dielectric resin.

According to some embodiments, a dummy chip 400 may be stacked on the first semiconductor chip 300. A dielectric layer 500 may provide direct-bonding between the first semiconductor chip 300 to the dummy chip 400. The first semiconductor chip 300 and the dummy chip 400 may be substantially the same as the first semiconductor chip 300 and the dummy chip 400 that are discussed with reference to FIGS. 1 and 2. According to other embodiments, the second substrate 100 may be mounted thereon with a plurality of chips discussed with reference to FIGS. 3, 4, and 12 to 14.

A heat radiation structure 960 may be disposed on the first substrate 900, and may cover the second substrate 100, the first and second semiconductor chips 300 and 200, and the dummy chip 400. The heat radiation structure 960 may include a thermal conductive material. The thermal conductive material may include a metallic material (e.g., copper and/or aluminum) or a carbon-containing material (e.g., graphene, graphite, and/or carbon nano-tube). For example, the heat radiation structure 960 may include a single metal layer or a plurality of stacked metal layers. For another example, the heat radiation structure 960 may include a heat sink or a heat pipe. For another example, the heat radiation structure 960 may be configured to use water cooling.

Thermal conductive layers 950 may be disposed top surfaces of the dummy chip 400 and the second semiconductor chip 200. The thermal conductive layers 950 may be interposed between the heat radiation structure 960 and the top surface of the dummy chip 400 and between the heat radiation structure 960 and the top surface of the second semiconductor chip 200. The thermal conductive layers 950 may include a thermal interface material (TIM). The thermal interface material may include, for example, a polymer and thermal conductive particles. The thermal conductive particles may be distributed in the polymer. Heat generated from the first and second semiconductor chips 300 and 200 may be transferred through the thermal conductive layers 950 to the heat radiation structure 960.

According to inventive concepts, the first semiconductor chip 300 may be provided thereon with the dummy chip 400 or the upper semiconductor chip 700. In this case, either the dummy chip 400 or the upper semiconductor chip 700 may compensate for a difference in height between a top surface of the first semiconductor chip 300 and a top surface of the second semiconductor chip 200, and therefore the thermal conductive layers 950 may be easily formed.

The first semiconductor chip 300 and the dummy chip 400 may be directly bonded to each other by the dielectric layer 500 that includes an inorganic dielectric material, or the first semiconductor chip 300 and the upper semiconductor chip 700 may be directly bonded to each other by direct contact between chip pads. In this case, the first semiconductor chip 300 and either the dummy chip 400 or the upper semiconductor chip 700 may be easily bonded to each other in a wafer-level bonding process. In addition, heat generated from the first semiconductor chip 300 may be easily discharged due to a material of the dielectric layer 500 and an arrangement of the chip pads.

As a result, a semiconductor package may be provided in which a plurality of semiconductor chips are easily mounted and heat radiation is improved.

The aforementioned description provides some example embodiments for explaining inventive concepts. Therefore, inventive concepts are not limited to the embodiments described above, and it will be understood by one of ordinary skill in the art that variations in form and detail may be made therein without departing from the spirit and features of inventive concepts.

What is claimed is:

1. A semiconductor package, comprising:
a substrate;
a first semiconductor chip on the substrate;
the first semiconductor chip including a plurality of first chip pads adjacent to a top surface of the first semiconductor chip;
a second semiconductor chip on the substrate, the second semiconductor chip laterally spaced apart from the first semiconductor chip; and
an upper semiconductor chip on the first semiconductor chip,
a bottom surface of the upper semiconductor chip facing the top surface of the first semiconductor chip,
the upper semiconductor chip including a plurality of second chip pads adjacent to the bottom surface of the upper semiconductor chip,
the plurality of second chip pads being directly connected to the plurality of first chip pads, and
the second semiconductor chip arranged so the top surface of the first semiconductor chip is lower than a top surface of the second semiconductor chip, wherein
the first semiconductor chip includes a plurality of through electrodes that penetrate an inside of the first semiconductor chip, and
the plurality of through electrodes are connected to corresponding ones of the plurality of second chip pads through corresponding ones of the plurality of first chip pads, wherein
the second semiconductor chip includes a plurality of sub-semiconductor chips that are stacked in a direction perpendicular to a top surface of the substrate, and
the plurality of sub-semiconductor chips include a plurality of memory chips.

2. The semiconductor package of claim 1, wherein
at least one of the plurality of first chip pads is electrically separated from the plurality of through electrodes.

3. The semiconductor package of claim 1, wherein the upper semiconductor chip includes a circuit layer adjacent to the bottom surface of the upper semiconductor chip.

4. The semiconductor package of claim 1, wherein
the top surface of the first semiconductor chip is lower than a top surface of an uppermost one of the plurality of sub-semiconductor chips.

5. The semiconductor package of claim 4, wherein the second semiconductor chip includes a plurality of through electrodes that penetrate the plurality of sub-semiconductor chips.

6. The semiconductor package of claim 1, wherein a thickness of the first semiconductor chip is less than a thickness of the second semiconductor chip.

7. The semiconductor package of claim 1, wherein the first semiconductor chip and the second semiconductor chip are different semiconductor chips from each other.

8. The semiconductor package of claim 1, further comprising:
a plurality of first bumps between the substrate and a bottom surface of the first semiconductor chip, the first bumps connecting the substrate to the first semiconductor chip; and
a plurality of second bumps between the substrate and a bottom surface of the second semiconductor chip, the second bumps connecting the substrate to the second semiconductor chip.

9. The semiconductor package of claim 1, wherein the substrate is an interposer substrate.

10. The semiconductor package of claim 1, wherein a top surface of the upper semiconductor chip and the top surface of the second semiconductor chip are at substantially a same height from the substrate.

11. A semiconductor package, comprising:
a substrate;
a first semiconductor chip on the substrate;
the first semiconductor chip including a plurality of first chip pads adjacent to a top surface of the first semiconductor chip;
a second semiconductor chip on the substrate, the second semiconductor chip laterally spaced apart from the first semiconductor chip;
an upper semiconductor chip on the first semiconductor chip; and
a dummy semiconductor chip on the substrate, the dummy semiconductor chip laterally spaced apart from the first semiconductor chip and the second semiconductor chip,
a bottom surface of the upper semiconductor chip facing the top surface of the first semiconductor chip,
the upper semiconductor chip including a plurality of second chip pads adjacent to the bottom surface of the upper semiconductor chip,
the plurality of second chip pads being directly connected to the plurality of first chip pads, and
the second semiconductor chip arranged so the top surface of the first semiconductor chip is lower than a top surface of the second semiconductor chip, wherein
the second semiconductor chip includes a plurality of sub-semiconductor chips that are stacked in a direction perpendicular to a top surface of the substrate, and
the plurality of sub-semiconductor chips include a plurality of memory chips.

12. The semiconductor package of claim 11, wherein the dummy semiconductor chip has no circuit layer.

13. The semiconductor package of claim 11, further comprising:
dummy bumps between the substrate and a bottom surface of the dummy semiconductor chip, the dummy bumps including a conductive material.

14. The semiconductor package of claim 11, further comprising:
an adhesive layer between the substrate and a bottom surface of the dummy semiconductor chip, the dummy semiconductor chip attached through the adhesive layer to the substrate.

15. The semiconductor package of claim 11, wherein a thickness of the dummy semiconductor chip is greater than a thickness of the first semiconductor chip.

16. A semiconductor package, comprising:
a substrate;
a first semiconductor chip on the substrate;
second semiconductor chips on the substrate, the second semiconductor chips laterally spaced apart from the first semiconductor chip and the first semiconductor chip disposed between the second semiconductor chips; and an upper semiconductor chip on the first semiconductor chip, wherein a thickness of the first semiconductor chip is less than a thickness of each of the second semiconductor chips, wherein the first semiconductor chip includes a plurality of first chip pads adjacent to a top surface of the first semiconductor chip, the upper semiconductor chip includes a plurality of second chip pads adjacent to a bottom surface of the upper semiconductor chip, and the bottom surface of the upper semiconductor chip faces with the top surface of the first semiconductor chip, and wherein the plurality of second chip pads are directly connected to the plurality of first chip pads, the first semiconductor chip includes a plurality of through electrodes that penetrate an inside of the first semiconductor chip, and the plurality of through electrodes are connected to corresponding ones of the plurality of second chip pads through corresponding ones of the plurality of first chip pads, wherein the second semiconductor chip includes a plurality of sub-semiconductor chips that are stacked in a direction perpendicular to a top surface of the substrate, and the plurality of sub-semiconductor chips include a plurality of memory chips.

17. The semiconductor package of claim 16, wherein at least one of the plurality of first chip pads are electrically separated from the plurality of through electrodes.

* * * * *